United States Patent
Maruyama et al.

(10) Patent No.: US 8,389,202 B2
(45) Date of Patent: Mar. 5, 2013

(54) POLYMER, RADIATION-SENSITIVE COMPOSITION, MONOMER, AND METHOD OF PRODUCING COMPOUND

(75) Inventors: Ken Maruyama, Tokyo (JP); Toru Kimura, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 13/427,855

(22) Filed: Mar. 22, 2012

(65) Prior Publication Data

US 2012/0178024 A1 Jul. 12, 2012

Related U.S. Application Data

(63) Continuation of application No. PCT/JP2010/065066, filed on Sep. 2, 2010.

(30) Foreign Application Priority Data

Sep. 30, 2009 (JP) .................................. 2009-228360
Jul. 13, 2010 (JP) .................................. 2010-159097

(51) Int. Cl.
*G03F 7/004* (2006.01)
*G03F 7/039* (2006.01)
*C08F 212/04* (2006.01)
*C08F 220/10* (2006.01)
*C08F 220/54* (2006.01)
*H01L 21/027* (2006.01)

(52) U.S. Cl. ...................... 430/270.1; 526/242; 526/266; 526/270; 526/286; 526/287; 526/282; 526/326; 526/304; 526/309; 549/416; 549/420; 549/475; 549/62; 549/292; 549/67; 560/221

(58) Field of Classification Search .................. None
See application file for complete search history.

(56) References Cited

U.S. PATENT DOCUMENTS

| | | | |
|---|---|---|---|
| 5,561,194 A | 10/1996 | Cornett et al. | |
| 5,744,537 A | 4/1998 | Brunsvold et al. | |
| 6,057,080 A | 5/2000 | Brunsvold et al. | |
| 6,492,086 B1 | 12/2002 | Barclay et al. | |
| 6,576,392 B1 | 6/2003 | Sato et al. | |
| 7,202,010 B2 | 4/2007 | Yamada et al. | |
| 7,700,256 B2 | 4/2010 | Barclay et al. | |
| 2003/0003392 A1 | 1/2003 | Niwa et al. | |
| 2003/0099900 A1 | 5/2003 | Yamada et al. | |
| 2003/0207200 A1 | 11/2003 | Barclay et al. | |
| 2009/0170029 A1* | 7/2009 | Choi et al. | 430/285.1 |
| 2010/0310987 A1* | 12/2010 | Maruyama et al. | 430/270.1 |
| 2012/0082935 A1* | 4/2012 | Kimura et al. | 430/285.1 |

FOREIGN PATENT DOCUMENTS

| | | |
|---|---|---|
| EP | 0159428 | 10/1985 |
| JP | 6-12452 B2 | 5/1984 |
| JP | 59-93448 | 5/1984 |
| JP | 5-188598 | 7/1993 |
| JP | 7-325402 | 12/1995 |
| JP | 2000-231194 | 8/2000 |
| JP | 2001-166474 | 6/2001 |
| JP | 2001-166478 | 6/2001 |
| JP | 2001-194792 | 7/2001 |
| JP | 2002-82439 | 3/2002 |
| JP | 2002-156760 | 5/2002 |
| JP | 2002-351080 | 12/2002 |
| JP | 2002-372785 | 12/2002 |
| JP | 2003-107708 | 4/2003 |

OTHER PUBLICATIONS

International Search Report for International Application No. PCT/JP2010/065066, Oct. 26, 2010.
J.V. Crivello, Cationic Polymerization-iodonium and Sulfonium Salt Photoinitiators, Advances in Polymer Science, 1984, p.1-48, vol. 62.

* cited by examiner

*Primary Examiner* — Cynthia Hamilton
(74) *Attorney, Agent, or Firm* — Ditthavong Mori & Steiner, P.C.

(57) ABSTRACT

A polymer includes a repeating unit shown by a general formula (1). $R^1$ represents a hydrogen atom, a methyl group, a fluorine atom, or a trifluoromethyl group. $R^2$ represents a substituted or unsubstituted aryl group having 6 to 22 carbon atoms. Y represents a carbon atom. X represents —$X^1Z^1X^2$— which is an atomic group which forms a cyclic structure including a heteroatom together with Y. $Z^1$ represents —O—, —S—, —CO—, —COO—, —SO—, or —$SO_2$—. Each of $X^1$ and $X^2$ individually represents a single bond, a methylene group, or an alkylene group having 2 to 25 carbon atoms. Each of $X^1$ and $X^2$ is unsubstituted or substituted with a substituent, and optionally a carbon atom included in $X^1$ and a carbon atom included in $X^2$ are bonded via a divalent group.

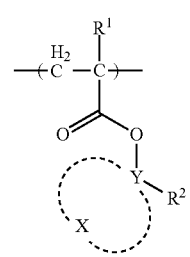

(1)

7 Claims, 1 Drawing Sheet

POLYMER, RADIATION-SENSITIVE COMPOSITION, MONOMER, AND METHOD OF PRODUCING COMPOUND

CROSS-REFERENCE TO RELATED APPLICATIONS

The present application is a continuation application of International Application No. PCT/JP2010/065066, filed Sep. 2, 2010, which claims priority to Japanese Patent Application No. 2009-228360, filed Sep. 30, 2009 and to Japanese Patent Application No. 2010-159097, filed Jul. 13, 2010. The contents of these applications are incorporated herein by reference in their entirety.

BACKGROUND OF THE INVENTION

1. Field of the Invention

The invention relates to a polymer, a radiation-sensitive composition, a monomer, and a method of producing a compound.

2. Discussion of the Background

A semiconductor device (e.g., IC and LSI) production process utilizes lithographic microfabrication using a photoresist composition. Along with an increase in the degree of integration of integrated circuits, it has become necessary to form a sub-micrometer or quarter-micrometer fine pattern. Therefore, i-lines, KrF excimer laser light, or ArF excimer laser light having a short exposure wavelength has been used instead of g-lines. Lithography that utilizes electron beams, X-rays, or EUV light instead of excimer laser light has also been developed.

Lithography that utilizes electron beams or EUV light is considered to be next-generation or third-generation patterning technology, and requires a positive-tone resist that exhibits high sensitivity and high resolution. In particular, an increase in sensitivity is very important for reducing the wafer processing time. However, when increasing the sensitivity of a positive-tone resist that is used for electron beams or EUV light, a deterioration in resolution and nano edge roughness occurs. Therefore, development of a resist that achieves these properties in combination has been strongly desired. Note that the term "nano edge roughness" refers to a phenomenon in which the edge of the resist pattern irregularly changes with respect to the substrate in the direction perpendicular to the line direction due to the properties of the resist, so that a difference occurs between the design dimensions and the actual pattern dimensions when viewed from above. The difference from the design dimensions is transferred by an etching step that uses the resist as a mask, and causes a deterioration in electrical properties. As a result, a decrease in yield occurs. In particular, it is very important to reduce the nano edge roughness when forming a fine pattern having a line width of 0.25 μm or less. High sensitivity, high resolution, an excellent pattern shape, and a small degree of nano edge roughness have a trade-off relationship. It is very important to achieve these properties at the same time.

It is also important to achieve high sensitivity, high resolution, an excellent pattern shape, and a small degree of nano edge roughness at the same time when using lithography that utilizes KrF excimer laser light.

As a resist suitable for a lithographic process that utilizes KrF excimer laser light, electron beams, or EUV light, a chemically-amplified resist that utilizes an acid catalytic reaction has been mainly used from the viewpoint of increasing sensitivity. As a positive-tone resist, a chemically-amplified resist composition that mainly includes a phenolic polymer (phenolic acid-labile polymer) that is insoluble or scarcely soluble in an alkaline solution, but becomes soluble in an alkaline solution due to an acid, and an acid generator, has been effectively used.

A resist composition that includes a phenolic acid-labile polymer obtained by copolymerizing an acid-labile acrylate monomer, and a compound (sulfonic acid generator) that generates sulfonic acid upon irradiation of active rays or radiation, has been known as such a positive-tone resist. For example, U.S. Pat. No. 5,561,194, Japanese Patent Application Publication (KOKAI) No. 2001-166474, Japanese Patent Application Publication (KOKAI) No. 2001-166478, Japanese Patent Application Publication (KOKAI) No. 2003-107708 and Japanese Patent Application Publication (KOKAI) No. 2001-194792 disclose such a positive-tone resist composition.

SUMMARY OF THE INVENTION

According to one aspect of the present invention, a polymer includes a repeating unit shown by a general formula (1).

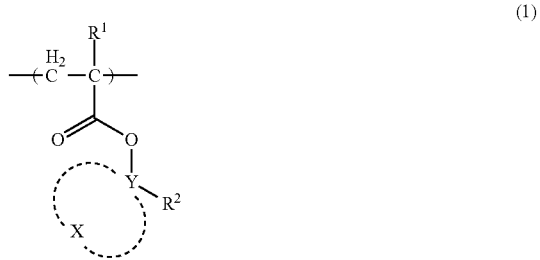

$R^1$ represents a hydrogen atom, a methyl group, a fluorine atom, or a trifluoromethyl group. $R^2$ represents a substituted or unsubstituted aryl group having 6 to 22 carbon atoms. Y represents a carbon atom. X represents —$X^1Z^1X^2$— which is an atomic group which forms a cyclic structure including a heteroatom together with Y. $Z^1$ represents —O—, —S—, —CO—, —COO—, —SO—, or —$SO_2$—. Each of $X^1$ and $X^2$ individually represents a single bond, a methylene group, or an alkylene group having 2 to 25 carbon atoms. Each of $X^1$ and $X^2$ is unsubstituted or substituted with a substituent, and optionally a carbon atom included in $X^1$ and a carbon atom included in $X^2$ are bonded via a divalent group.

According to another aspect of the present invention, a radiation-sensitive composition includes the polymer and a photoacid generator. The polymer contains an acid-labile group.

According to further aspect of the present invention, a monomer is a compound shown by a general formula (10).

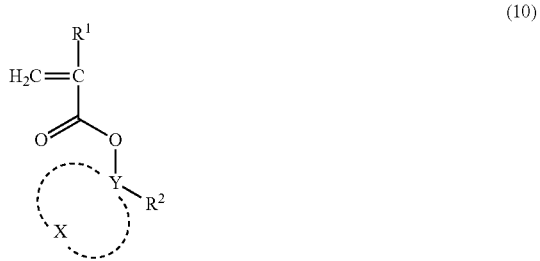

$R^1$ represents a hydrogen atom, a methyl group, a fluorine atom, or a trifluoromethyl group. $R^2$ represents a substituted or unsubstituted aryl group having 6 to 22 carbon atoms. Y represents a carbon atom. X represents $—X^1Z^1X^2—$ which is an atomic group which forms a cyclic structure including a heteroatom together with Y. $Z^1$ represents $—O—$, $—S—$, $—CO—$, $—COO—$, $—SO—$, or $—SO_2—$. Each of $X^1$ and $X^2$ individually represents a single bond, a methylene group, or an alkylene group having 2 to 25 carbon atoms. Each of $X^1$ and $X^2$ is unsubstituted or substituted with a substituent, and optionally a carbon atom included in $X^1$ and a carbon atom included in $X^2$ are bonded via a divalent group.

According to further aspect of the present invention, a method of producing a compound shown by a general formula (10) includes providing a first compound shown by a formula (AA) and a second compound. The second compound has a partial structure shown by a formula (BB). The first compound and the second compound are reacted to replace $Y^1$ in the first compound with the partial structure in the second compound.

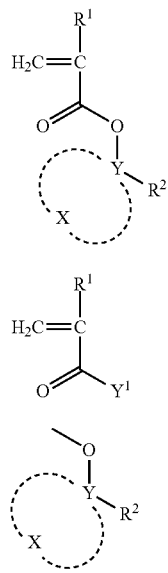

(10)

(AA)

(BB)

$R^1$ represents a hydrogen atom, a methyl group, a fluorine atom, or a trifluoromethyl group. $R^2$ represents a substituted or unsubstituted aryl group having 6 to 22 carbon atoms. Y represents a carbon atom. $Y^1$ represents a halogen atom. X represents $—X^1Z^1X^2—$ which is an atomic group which forms a cyclic structure including a heteroatom together with Y. $Z^1$ represents $—O—$, $—S—$, $—CO—$, $—COO—$, $—SO—$, or $—SO_2—$. Each of $X^1$ and $X^2$ individually represents a single bond, a methylene group, or an alkylene group having 2 to 25 carbon atoms. Each of $X^1$ and $X^2$ is unsubstituted or substituted with a substituent, and optionally a carbon atom included in $X^1$ and a carbon atom included in $X^2$ are bonded via a divalent group.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

Figure 1:
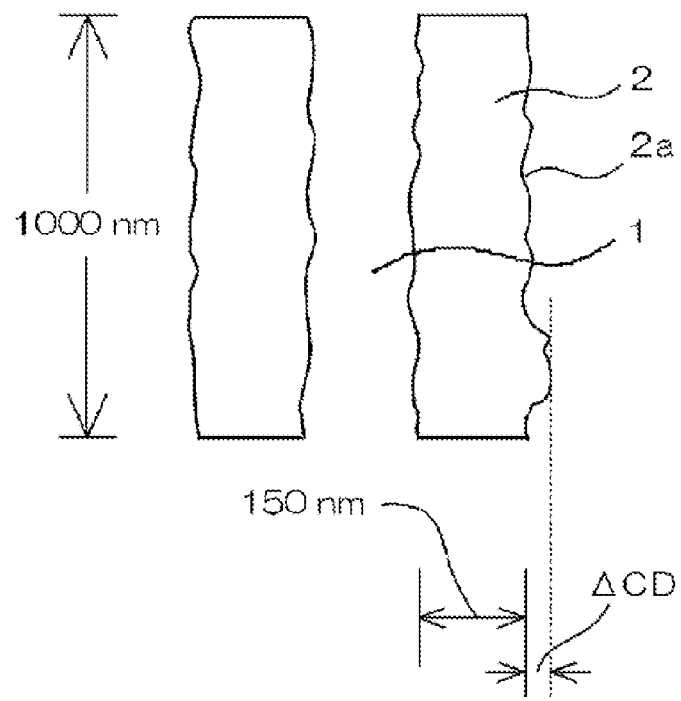
FIG. 1 is a plan view schematically showing a line pattern.

Embodiments of the present invention provide the following.

1. A polymer including a repeating unit shown by a general formula (1),

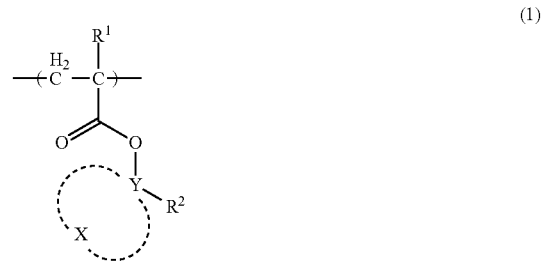

(1)

wherein $R^1$ represents a hydrogen atom, a methyl group, a fluorine atom, or a trifluoromethyl group, $R^2$ represents a substituted or unsubstituted aryl group having 6 to 22 carbon atoms, Y represents a carbon atom, X represents $—X^1Z^1X^2—$ that is an atomic group that forms a cyclic structure including a heteroatom together with Y, $Z^1$ represents $—O—$, $—S—$, $—CO—$, $—COO—$, $—SO—$, or $—SO_2—$, and $X^1$ and $X^2$ individually represent a single bond, a methylene group, or an alkylene group having 2 to 25 carbon atoms, provided that $X^1$ and $X^2$ may be substituted with a substituent, and a carbon atom included in $X^1$ and a carbon atom included in $X^2$ may be bonded via a divalent group.

2. The polymer according to 1, wherein the repeating unit shown by the general formula (1) is a repeating unit shown by a general formula (1-1),

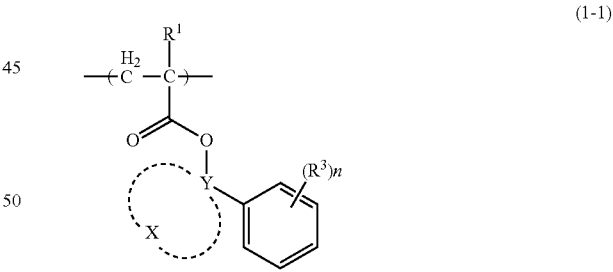

(1-1)

wherein n is an integer from 0 to 3, $R^1$ represents a hydrogen atom, a methyl group, a fluorine atom, or a trifluoromethyl group, $R^3$ represents a monovalent organic group, a hydroxyl group, or a halogen atom, Y represents a carbon atom, X represents $—X^1Z^1X^2—$ that is an atomic group that forms a cyclic structure including a heteroatom together with Y, $Z^1$ represents $—O—$, $—S—$, $—CO—$, $—COO—$, $—SO—$, or $—SO_2—$, and $X^1$ and $X^2$ individually represent a single bond, a methylene group, or an alkylene group having 2 to 25 carbon atoms, provided that $X^1$ and $X^2$ may be substituted with a substituent, and a carbon atom included in $X^1$ and a carbon atom included in $X^2$ may be bonded via a divalent group.

3. The polymer according to 1 or 2, further including at least one repeating unit selected from a repeating unit shown by a general formula (2), a repeating unit shown by a general formula (3), a repeating unit shown by a general formula (4), a repeating unit shown by a general formula (5), and a repeating unit shown by a general formula (N),

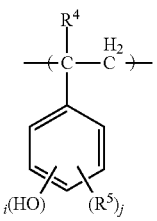
(2)

wherein $R^4$ represents a hydrogen atom or a methyl group, $R^5$ represents a hydrogen atom or a monovalent organic group, i is an integer from 0 to 3, and j is an integer from 0 to 3, provided that $0 \leq i+j \leq 5$ is satisfied,

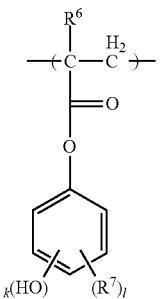
(3)

wherein $R^6$ represents a hydrogen atom or a methyl group, $R^7$ represents a hydrogen atom or a monovalent organic group, k is an integer from 0 to 3, and l is an integer from 0 to 3, provided that $0 \leq k+l \leq 5$ is satisfied,

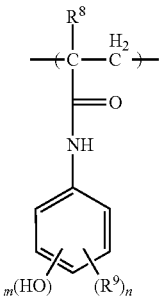
(4)

wherein $R^8$ represents a hydrogen atom or a methyl group, $R^9$ represents a hydrogen atom or a monovalent organic group, m is an integer from 0 to 3, and n is an integer from 0 to 3, provided that $0 \leq m+n \leq 5$ is satisfied,

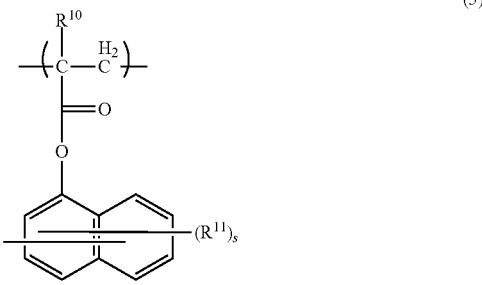
(5)

wherein $R^{10}$ represents a hydrogen atom or a methyl group, $R^{11}$ represents a hydrogen atom or a monovalent organic group, r is an integer from 0 to 3, and s is an integer from 0 to 3,

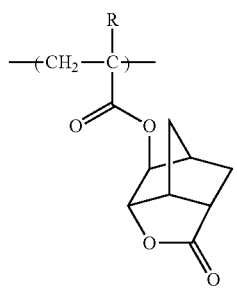
(N)

wherein R represents a hydrogen atom or methyl group.

4. A radiation-sensitive composition including (A) an acid-labile group-containing polymer, and (B) a photoacid generator, the acid-labile group-containing polymer (A) being the polymer according to any one of 1 to 3.

5. The radiation-sensitive composition according to 4, wherein the photoacid generator (B) is a compound shown by a general formula (b1), $$M^+Z^-  \quad (b1)$$

wherein $M^+$ represents a monovalent onium cation, and $Z^-$ represents a monovalent anion shown by a general formula (9-1) or (9-2),

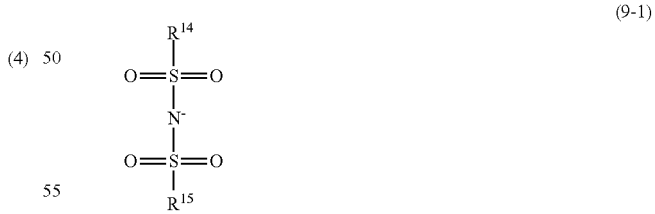
(9-1)

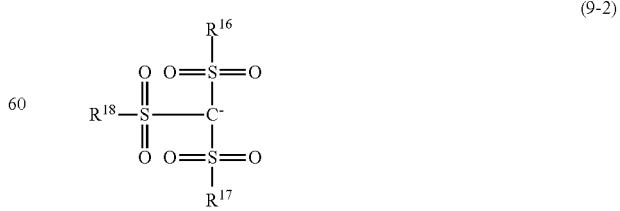
(9-2)

wherein $R^{14}$ and $R^{15}$ individually represent an alkyl group having 1 to 20 carbon atoms that is substituted with at least one fluorine atom, or bond to each other to form a cyclic structure having 1 to 20 carbon atoms that is substituted with at least one fluorine atom, and $R^{16}$, $R^{17}$, and $R^{18}$ individually represent an alkyl group having 1 to 20 carbon atoms that is substituted with at least one fluorine atom, or two of $R^{16}$, $R^{17}$, and $R^{18}$ bond to each other to form a cyclic structure having 1 to 20 carbon atoms that is substituted with at least one fluorine atom, and the remainder of $R^{16}$, $R^{17}$, and $R^{18}$ represents an alkyl group having 1 to 20 carbon atoms that is substituted with at least one fluorine atom.

6. A monomer that is a compound shown by a general formula (10),

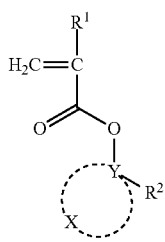

(10)

wherein $R^1$ represents a hydrogen atom, a methyl group, a fluorine atom, or a trifluoromethyl group, $R^2$ represents a substituted or unsubstituted aryl group having 6 to 22 carbon atoms, Y represents a carbon atom, X represents —$X^1Z^1X^2$— that is an atomic group that forms a cyclic structure including a heteroatom together with Y, $Z^1$ represents —O—, —S—, —CO—, —COO—, —SO—, or —SO$_2$—, and $X^1$ and $X^2$ individually represent a single bond, a methylene group, or an alkylene group having 2 to 25 carbon atoms, provided that $X^1$ and $X^2$ may be substituted with a substituent, and a carbon atom included in $X^1$ and a carbon atom included in $X^2$ may be bonded via a divalent group.

7. A method of producing a compound shown by a general formula (10), including providing a first compound shown by a formula (AA) and a second compound, the second compound having a partial structure shown by a formula (BB), and reacting the first compound and the second compound to replace $Y^1$ in the first compound with the partial structure in the second compound,

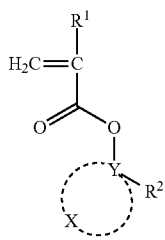

(10)

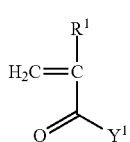

(AA)

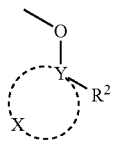

(BB)

wherein $R^1$ represents a hydrogen atom, a methyl group, a fluorine atom, or a trifluoromethyl group, $R^2$ represents a substituted or unsubstituted aryl group having 6 to 22 carbon atoms, Y represents a carbon atom, $Y^1$ represents a halogen atom, and X represents —$X^1Z^1X^2$— which is an atomic group which forms a cyclic structure including a heteroatom together with Y, wherein $Z^1$ represents —O—, —S—, —CO—, —COO—, —SO—, or —SO$_2$—, and each of $X^1$ and $X^2$ individually represents a single bond, a methylene group, or an alkylene group having 2 to 25 carbon atoms, each of $X^1$ and $X^2$ being unsubstituted or substituted with a substituent, and optionally a carbon atom included in $X^1$ and a carbon atom included in $X^2$ being bonded via a divalent group.

Since the polymer according to the embodiment of the invention is insoluble or scarcely soluble in an alkali, but becomes readily soluble in an alkali due to an acid, the polymer may suitably be used as an acid-labile group-containing polymer used for a radiation-sensitive composition.

The radiation-sensitive composition according the embodiment of the invention may produce a chemically-amplified positive-tone resist film that effectively responds to (extreme) deep ultraviolet rays (e.g., KrF excimer laser light, ArF excimer laser light, or EUV), X-rays such as synchrotron radiation, or electron beams, shows only a small degree of nano edge roughness, exhibits excellent sensitivity and resolution, and stably and accurately produces a fine pattern.

The monomer according to the embodiment of the invention may suitably be used to form the polymer according to the embodiment of the invention.

The embodiments will now be described with reference to the accompanying drawings, wherein like reference numerals designate corresponding or identical elements throughout the various drawings.

1. Polymer

A polymer (hereinafter referred to as "polymer (1)") according to one embodiment of the invention includes a repeating unit shown by the following general formula (1) (hereinafter referred to as "repeating unit (1)").

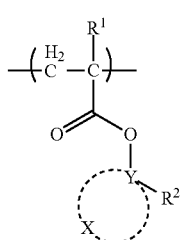

(1)

wherein $R^1$ represents a hydrogen atom, a methyl group, a fluorine atom, or a trifluoromethyl group, $R^2$ represents a substituted or unsubstituted aryl group having 6 to 22 carbon atoms, Y represents a carbon atom, X represents —$X^1Z^1X^2$— that is an atomic group that forms a cyclic structure including a heteroatom together with Y, $Z^1$ represents —O—, —S—, —CO—, —COO—, —SO—, or —SO$_2$—, and X$^1$ and X$^2$ individually represent a single bond, a methylene group, or an alkylene group having 2 to 25 carbon atoms, provided that X$^1$ and X$^2$ may be substituted with a substituent, and carbon atoms respectively included in X$^1$ and X$^2$ may be bonded via a divalent group.

Y in the general formula (1) represents a carbon atom. R$^2$ is bonded to the carbon atom represented by Y. R$^2$ represents a substituted or unsubstituted aryl group having 6 to 22 carbon atoms, and may be a group derived from any of the structures shown by the following formulas (x-1) to (x-3), and the like. When R$^2$ represents a group (i.e., naphthyl group) derived from the structure shown by the formula (x-2), R$^2$ may be bonded to Y (carbon atom) in the general formula (1) at the 1-position or the 2-position. When R$^2$ represents a group (i.e., anthryl group) derived from the structure shown by the formula (x-3), R$^2$ may be bonded to Y (carbon atom) in the general formula (1) at the 1-position, the 2-position, or the 9-position.

Although the structures shown by the formulas (x-1) to (x-3) are not substituted with a substituent, the structures shown by the formulas (x-1) to (x-3) may be substituted with a substituent. Examples of the substituent include a methyl group, an ethyl group, a propyl group, a hydroxyl group, a carboxyl group, a halogen atom (e.g., fluorine atom, chlorine atom, and bromine atom), an alkoxy group (e.g., methoxy group, ethoxy group, propoxy group, and butoxy group), an alkyloxycarbonyl group, and the like.

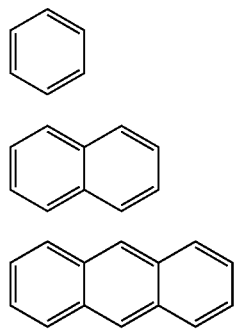

(x-1)

(x-2)

(x-3)

X in the general formula (1) represents an atomic group that forms a cyclic structure including a heteroatom together with Y (carbon atom). The number of carbon atoms of the cyclic structure formed by X together with Y (carbon atom) is preferably 5 to 25, more preferably 5 to 20, and still more preferably 5 to 15.

X represents —X$^1$Z$^1$X$^2$—, and Z$^1$ represents —O—, —S—, —CO—, —COO—, —SO—, or —SO$_2$—. X$^1$ and X$^2$ individually represent a single bond, a methylene group, or an alkylene group having 2 to 25 carbon atoms, provided that X$^1$ and X$^2$ may be substituted with a substituent, and carbon atoms respectively included in X$^1$ and X$^2$ may be bonded via a divalent group. Examples of a substituent that substitutes X$^1$ and/or X$^2$ include a methyl group, an ethyl group, a propyl group, a hydroxyl group, a carboxyl group, a halogen atom (e.g., fluorine atom, chlorine atom, and bromine atom), an alkoxy group (e.g., methoxy group, ethoxy group, propoxy group, and butoxy group), an alkyloxycarbonyl group, and the like. X$^1$ and X$^2$ preferably represent a methylene group or an ethylene group.

Examples of the repeating unit (1) include a repeating unit shown by the following general formula (1-1) (hereinafter referred to as "repeating unit (1-1)"), and the like.

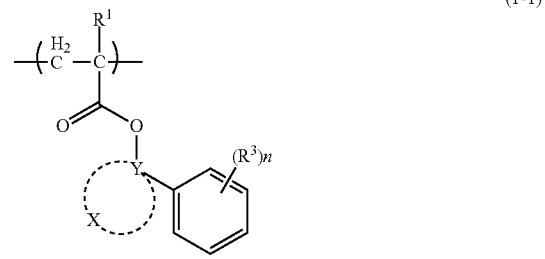

(1-1)

wherein n is an integer from 0 to 3, R$^1$ represents a hydrogen atom, a methyl group, a fluorine atom, or a trifluoromethyl group, R$^3$ represents a monovalent organic group, a hydroxyl group, or a halogen atom, Y represents a carbon atom, X represents —X$^1$Z$^1$X$^2$— that is an atomic group that forms a cyclic structure including a heteroatom together with Y, Z$^1$ represents —O—, —S—, —CO—, —COO—, —SO—, or —SO$_2$—, and X$^1$ and X$^2$ individually represent a single bond, a methylene group, or an alkylene group having 2 to 25 carbon atoms, provided that X$^1$ and X$^2$ may be substituted with a substituent, and carbon atoms respectively included in X$^1$ and X$^2$ may be bonded via a divalent group.

The description given above in connection with the cyclic structure formed by X together with Y in the general formula (1) may be applied to the cyclic structure formed by X together with Y in the general formula (1-1).

n in the general formula (1-1) is an integer from 0 to 3, and is preferably 0 or 1.

R$^3$ in the general formula (1-1) represents a monovalent organic group, a hydroxyl group, or a halogen atom. Examples of the monovalent organic group include a methyl group, an ethyl group, a propyl group, a carboxyl group, a halogen atom (e.g., fluorine atom and bromine atom), an alkoxy group (e.g., methoxy group, ethoxy group, propoxy group, and butoxy group), an alkyloxycarbonyl group, and the like. Among these, a methyl group, an ethyl group, and a propyl group are preferable.

When n in the general formula (1-1) is 2 or 3, a plurality of R$^3$ may be either the same or different.

Examples of the repeating unit (1-1) include repeating units shown by the following general formulas (1-1-1) to (1-1-22).

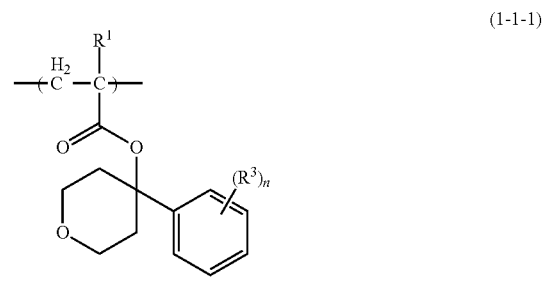

(1-1-1)

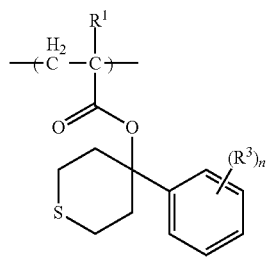
(1-1-2)
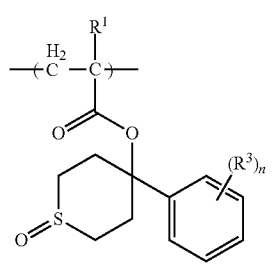
(1-1-3)
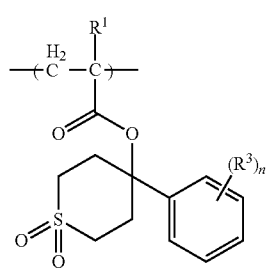
(1-1-4)
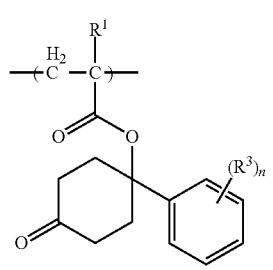
(1-1-5)
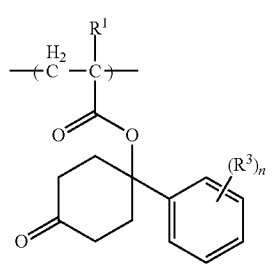
(1-1-6)
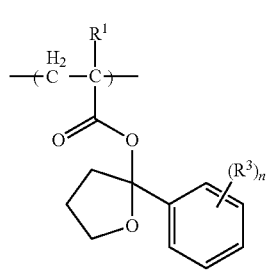
(1-1-7)
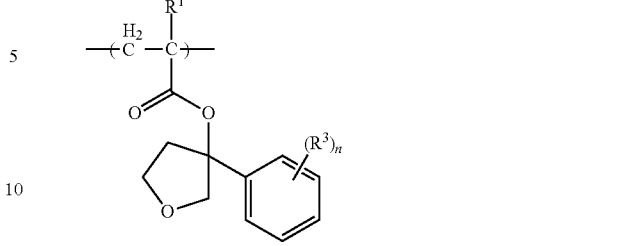
(1-1-8)
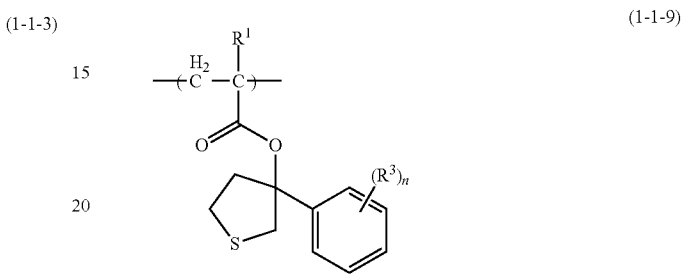
(1-1-9)
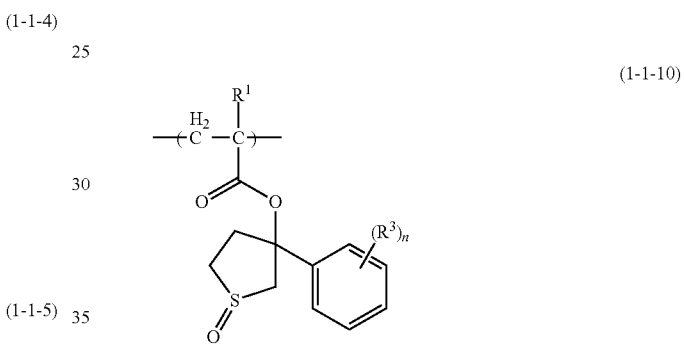
(1-1-10)
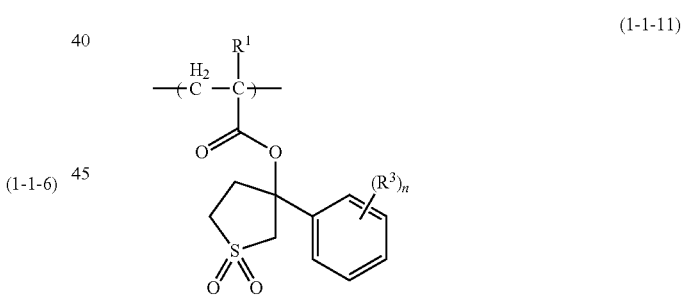
(1-1-11)
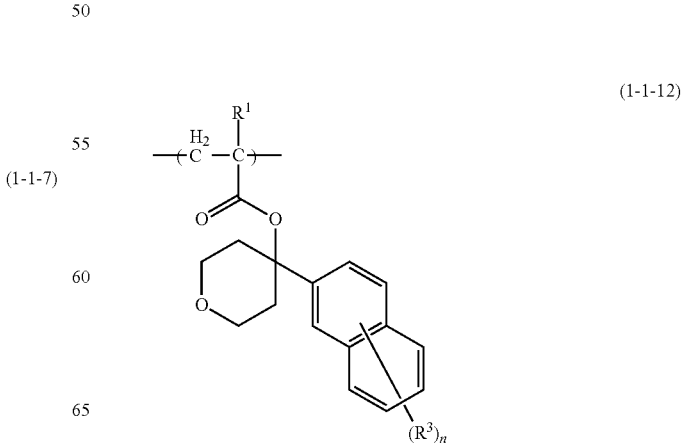
(1-1-12)

(1-1-13)
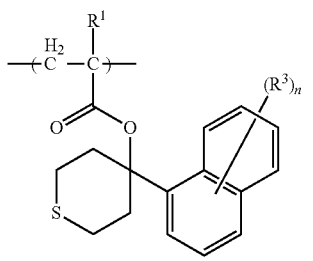

(1-1-14)
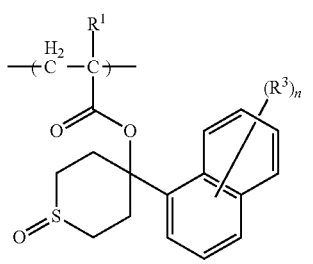

(1-1-15)
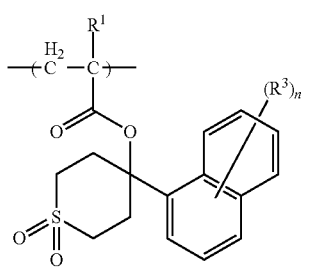

(1-1-16)
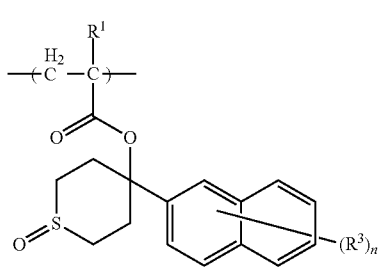

(1-1-17)
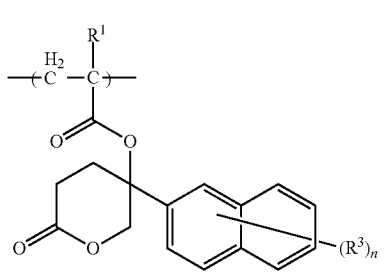

(1-1-18)
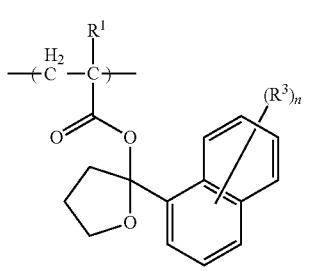

(1-1-19)
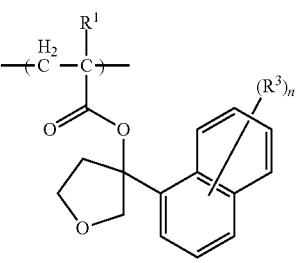

(1-1-20)
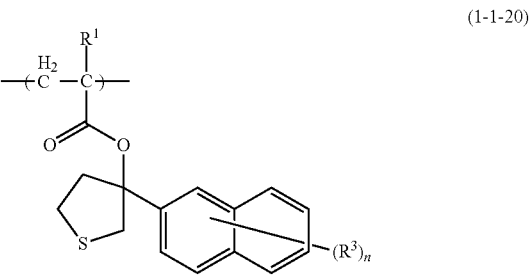

(1-1-21)
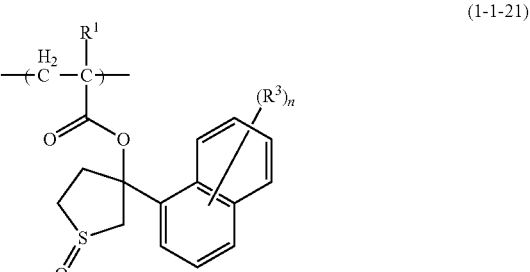

(1-1-22)
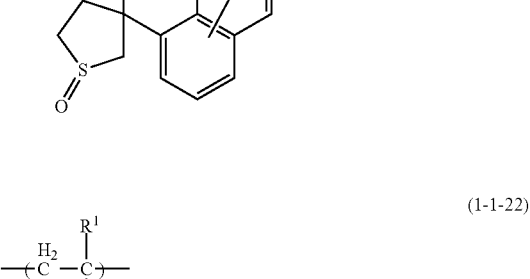

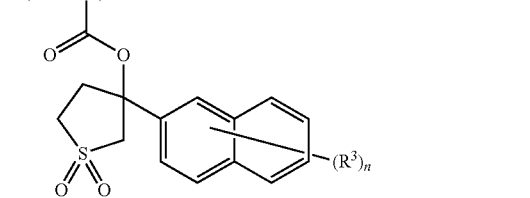

wherein $R^1$ represents a hydrogen atom, a methyl group, a fluorine atom, or a trifluoromethyl group, $R^3$ represents a monovalent organic group, a hydroxyl group, or a halogen atom, and n is an integer from 0 to 3.

The description given above in connection with $R^1$, $R^3$, and n in the general formula (1-1) may be applied to $R^1$, $R^3$, and n in the general formulas (1-1-1) to (1-1-22).

The repeating unit (1) may be obtained using a compound shown by the following general formula (10) (monomer according to one embodiment of the invention) as a monomer, for example.

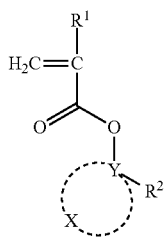

(10)

wherein $R^1$ represents a hydrogen atom, a methyl group, a fluorine atom, or a trifluoromethyl group, $R^2$ represents a substituted or unsubstituted aryl group having 6 to 22 carbon atoms, Y represents a carbon atom, X represents —$X^1Z^1X^2$— that is an atomic group that forms a cyclic structure including a heteroatom together with Y, $Z^1$ represents —O—, —S—, —CO—, —COO—, —SO—, or —$SO_2$—, and $X^1$ and $X^2$ individually represent a single bond, a methylene group, or an alkylene group having 2 to 25 carbon atoms, provided that $X^1$ and $X^2$ may be substituted with a substituent, and carbon atoms respectively included in $X^1$ and $X^2$ may be bonded via a divalent group.

The description given above in connection with $R^1$, $R^2$, and X in the general formula (1) may be applied to $R^1$, $R^2$, and X in the general formula (10).

The compound shown by the general formula (10) (monomer according to one embodiment of the invention) may be produced by reacting a compound shown by $CH_2$=$C(R^1)C$(=O)X (wherein $R^1$ represents a hydrogen atom, a methyl group, a fluorine atom, or a trifluoromethyl group, and X represents a halogen atom) with a compound that can undergo a substitution reaction with X.

A production example of a compound (1-1-1a) that can form the repeating unit shown by the general formula (1-1-1) is given below. The compound (1-1-1a) may be produced by reacting a compound shown by the following general formula (1-r1) with a compound shown by the following general formula (1-r2).

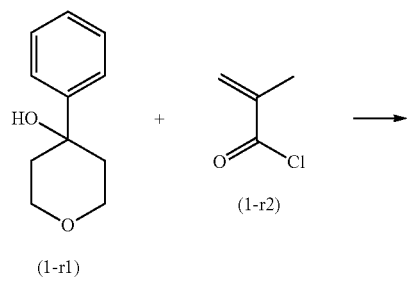

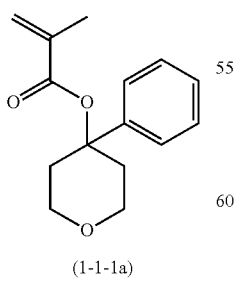

(1-1-1a)

The polymer (1) according to one embodiment of the invention includes the repeating unit (1). The polymer (1) may include only the repeating unit (1), or may further include at least one of a repeating unit shown by the following general formula (2) (hereinafter may be referred to as "repeating unit (2)"), a repeating unit shown by the following general formula (3) (hereinafter may be referred to as "repeating unit (3)"), a repeating unit shown by the following general formula (4) (hereinafter may be referred to as "repeating unit (4)"), a repeating unit shown by the following general formula (5) (hereinafter may be referred to as "repeating unit (5)"), and a repeating unit shown by the following general formula (N) (hereinafter may be referred to as "repeating unit (N)"), in addition to the repeating unit (1).

The lower limit of the content of the repeating unit (1) in the polymer (1) is preferably 1 mol %, more preferably 5 mol %, and still more preferably 10 mol %, based on the total amount (100 mol %) of the repeating units included in the polymer (1).

(2)

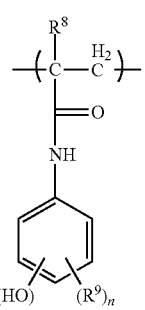

wherein $R^4$ represents a hydrogen atom or a methyl group, $R^5$ represents a hydrogen atom or a monovalent organic group, i is an integer from 0 to 3, and j is an integer from 0 to 3, provided that $0 \leq i+j \leq 5$ is satisfied, (3)

wherein $R^6$ represents a hydrogen atom or a methyl group, $R^7$ represents a hydrogen atom or a monovalent organic group, k is an integer from 0 to 3, and l is an integer from 0 to 3, provided that $0 \leq k+l \leq 5$ is satisfied, (4)

wherein $R^8$ represents a hydrogen atom or a methyl group, $R^9$ represents a hydrogen atom or a monovalent organic group, m is an integer from 0 to 3, and n is an integer from 0 to 3, provided that $0 \leq m+n \leq 5$ is satisfied,

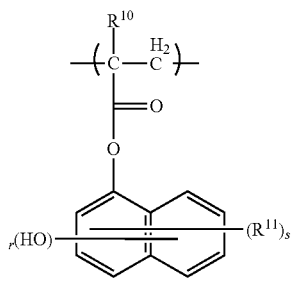
(5)

wherein $R^{10}$ represents a hydrogen atom or a methyl group, $R^{11}$ represents a hydrogen atom or a monovalent organic group, r is an integer from 1 to 3, and s is an integer from 0 to 3,

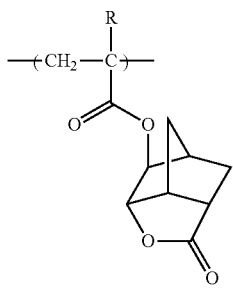
(N)

wherein R represents a hydrogen atom or methyl group.

$R^5$ in the general formula (2) represents a hydrogen atom or a monovalent organic group. Examples of the monovalent organic group represented by $R^5$ include linear or branched alkyl groups having 1 to 12 carbon atoms (e.g., methyl group, ethyl group, n-propyl group, isopropyl group, n-butyl group, 2-methylpropyl group, 1-methylpropyl group, and t-butyl group), linear or branched alkoxy groups having 1 to 12 carbon atoms (e.g., methoxy group, ethoxy group, n-propoxy group, isopropoxy group, n-butoxy group, 2-methylpropoxy group, 1-methylpropoxy group, and t-butoxy group), cycloalkyl groups (e.g., cyclopentyl group, cyclohexyl group, cycloheptyl group, cyclooctyl group, cyclodecanyl group, and cyclododecanyl group), an adamantyl group, a noradamantyl group, a decal in residue (decalinyl group), a tricyclodecanyl group, a tetracyclododecanyl group, a norbornyl group, a cedrol group, and the like. Among these, a methyl group, an ethyl group, an n-butyl group, and a t-butyl group are preferable. i in the general formula (2) is an integer from 0 to 3, and preferably 1 or 2. j in the general formula (2) is an integer from 0 to 3, and preferably an integer from 0 to 2.

Examples of the repeating unit (2) shown by the general formula (2) include the repeating units shown by the following formulas (2-1) and (2-4), and the like.

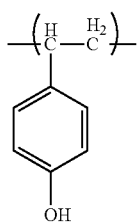
(2-1)

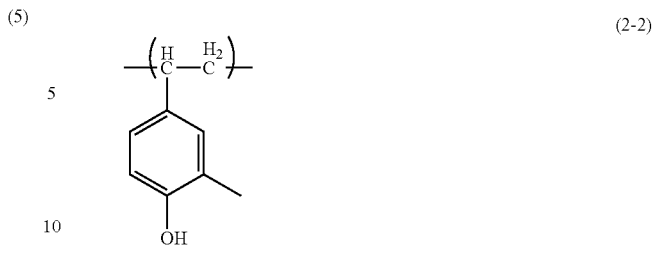
(2-2)

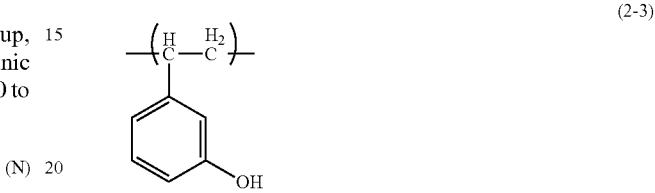
(2-3)

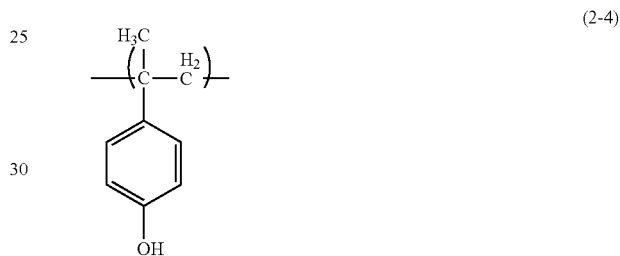
(2-4)

Note that the polymer (1) may include only one type of the repeating unit (2), or may include two or more types of the repeating units (2).

$R^7$ in the general formula (3) represents a hydrogen atom or a monovalent organic group. The description given above in connection with the monovalent organic group represented by $R^5$ in the general formula (2) may be applied to the monovalent organic group represented by $R^7$ in the general formula (3). k in the general formula (3) is an integer from 0 to 3, and preferably 1 or 2. l in the general formula (3) is an integer from 0 to 3, and preferably 0 or 1.

Examples of the repeating unit shown by the general formula (3) include the repeating units shown by the following formulas (3-1) and (3-2), and the like.

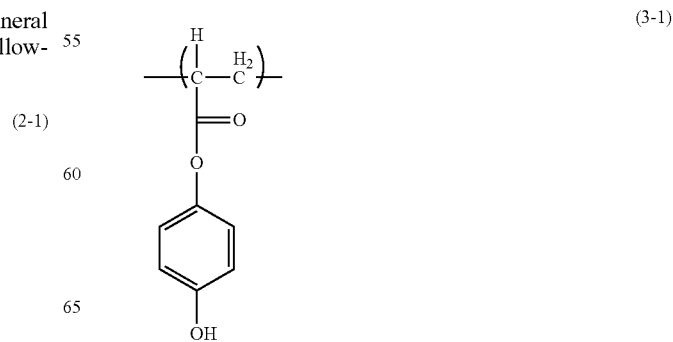
(3-1)

-continued

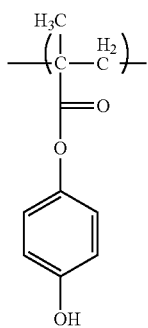
(3-2)

Note that the polymer (1) may include only one type of the repeating unit (3), or may include two or more types of the repeating units (3).

$R^9$ in the general formula (4) represents a hydrogen atom or a monovalent organic group. The description given above in connection with the monovalent organic group represented by $R^5$ in the general formula (2) may be applied to the monovalent organic group represented by $R^9$ in the general formula (4). m in the general formula (4) is an integer from 0 to 3, and preferably 1 or 2. n in the general formula (4) is an integer from 0 to 3, and preferably 0 or 1.

Examples of the repeating unit shown by the general formula (4) include the repeating units shown by the following formulas (4-1) and (4-2), and the like.

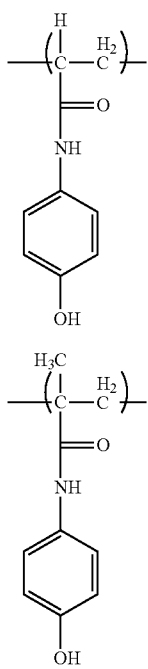
(4-1)

(4-2)

Note that the polymer (1) may include only one type of the repeating unit (4), or may include two or more types of the repeating units (4).

$R^{11}$ in the general formula (5) represents a hydrogen atom or a monovalent organic group. The description given above in connection with the monovalent organic group represented by $R^5$ in the general formula (2) may be applied to the monovalent organic group represented by $R^{11}$ in the general formula (5).

r in the general formula (5) is an integer from 0 to 3, and preferably 1 or 2.

s in the general formula (5) is an integer from 0 to 3, and preferably 0 or 1.

Examples of the repeating unit (5) shown by the general formula (5) include the repeating units shown by the following formulas (5-1) and (5-2), and the like.

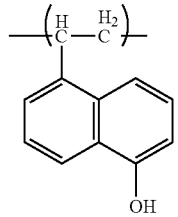
(5-1)

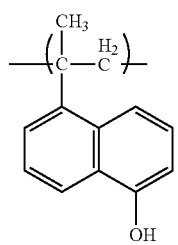
(5-2)

Examples of the repeating unit (N) shown by the general formula (N) include the repeating units shown by the following formulas (N-1) and (N-2).

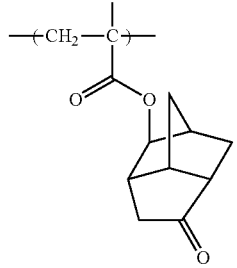
(N-1)

(N-2)

Note that the polymer (1) may include only one type of the repeating unit (N), or may include two or more types of the repeating units (N).

The repeating units shown by the formulas (2-1) to (2-3) may be obtained using the corresponding hydroxystyrene derivative as a monomer. The repeating units shown by the formulas (2-1) to (2-3) may also be obtained using a compound that produces the corresponding hydroxystyrene derivative via hydrolysis as a monomer.

p-Acetoxystyrene, p-(1-ethoxyethoxy)styrene, and the like are preferable as the monomers used to produce the repeating units shown by the formulas (2-1) to (2-3). When using these monomers, the repeating units shown by the formulas (2-1) to (2-3) may be produced by polymerizing the monomers, and hydrolyzing the side chain of the resulting polymer.

The repeating units shown by the formulas (2-4), (3-1), (3-2), (4-1), (4-2), (5-1), (5-2), (N-1), and (N-2) may be obtained using the corresponding monomer.

The monomers used to produce the repeating units shown by the formulas (2-4), (3-1), (3-2), (4-1), (4-2), (5-1), (5-2), (N-1), and (N-2) are preferably p-isopropenylphenol, 4-hydroxyphenyl acrylate, 4-hydroxyphenyl methacrylate, N-(4-hydroxyphenyl)acrylamide, N-(4-hydroxyphenyl)methacrylamide, 5-hydroxynaphthalen-1-yl methacrylate, 5-hydroxynaphthalen-1-yl acrylate, the compound shown by the following formula (n-1), the compound shown by the following formula (n-2), or the like.

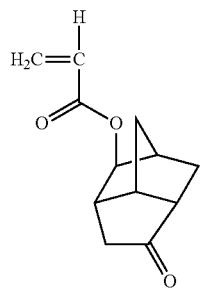
(n-1)

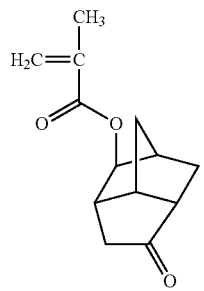
(n-2)

The polymer (1) may further include a repeating unit derived from a non-acid-labile compound (hereinafter may be referred to as "repeating unit (6)") and a repeating unit derived from an acid-labile compound (hereinafter may be referred to as "repeating unit (7)") other than the repeating units (1) to (5) and (N).

Examples of the non-acid-labile compound that produces the repeating unit (6) include styrene, α-methylstyrene, 4-methylstyrene, 2-methylstyrene, 3-methylstyrene, isobornyl acrylate, tricyclodecanyl(meth)acrylate, tetracyclododecenyl(meth)acrylate, and the like. Among these, styrene, α-methylstyrene, 4-methylstyrene, 2-methylstyrene, 3-methylstyrene, and tricyclodecanyl acrylate are preferable.

Note that the polymer (1) may include only one type of the repeating unit (6), or may include two or more types of the repeating units (6).

Examples of the acid-labile compound that produces the repeating unit (7) include compounds shown by the following general formulas (7-1) and (7-2), and the like.

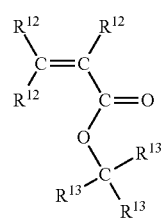
(7-1)

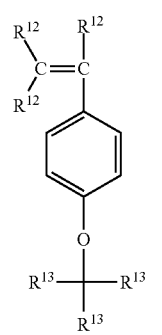
(7-2)

wherein $R^{12}$ individually represent a hydrogen atom, a methyl group, a trifluoromethyl group, or a hydroxymethyl group, and $R^{13}$ individually represent a linear or branched alkyl group having 1 to 4 carbon atoms, a monovalent alicyclic hydrocarbon group having 4 to 20 carbon atoms, or a group derived therefrom, or two of $R^{13}$ bond to each other to form a divalent alicyclic hydrocarbon group having 4 to 20 carbon atoms, or a group derived therefrom, together with the carbon atom that is bonded to the two $R^{13}$, and the remainder of $R^{13}$ represents a linear or branched alkyl group having 1 to 4 carbon atoms, a monovalent alicyclic hydrocarbon group having 4 to 20 carbon atoms, or a group derived therefrom.

Examples of the linear or branched alkyl group having 1 to 4 carbon atoms represented by $R^{13}$ in the general formulas (7-1) and (7-2) include a methyl group, an ethyl group, an n-propyl group, an isopropyl group, an n-butyl group, a 2-methylpropyl group, a 1-methylpropyl group, a t-butyl group, and the like.

Examples of the monovalent alicyclic hydrocarbon group having 4 to 20 carbon atoms represented by $R^{13}$ include a group that includes an alicyclic ring derived from a cycloalkane such as norbornane, tricyclodecane, tetracyclododecane, adamantane, cyclobutane, cyclopentane, cyclohexane, cycloheptane, or cyclooctane, and the like.

Examples of a group derived from the alicyclic hydrocarbon group include a group obtained by substituting at least one hydrogen atom of the monovalent alicyclic hydrocarbon group with a linear, branched, or cyclic alkyl group having 1 to 4 carbon atoms, such as a methyl group, an ethyl group, an n-propyl group, an isopropyl group, an n-butyl group, a 2-methylpropyl group, a 1-methylpropyl group, or a t-butyl group, and the like.

The monovalent alicyclic hydrocarbon group having 4 to 20 carbon atoms represented by $R^{13}$ is preferably a group that includes an alicyclic ring derived from norbornane, tricyclodecane, tetracyclododecane, adamantane, cyclopentane, or cyclohexane, a group obtained by substituting at least one hydrogen atom of the group that includes an alicyclic ring with any of the above alkyl groups, or the like.

Examples of the divalent alicyclic hydrocarbon group having 4 to 20 carbon atoms that is formed by two of $R^{13}$ together with the carbon atom that is bonded to the two $R^{13}$ (i.e., the carbon atom bonded to the oxygen atom) include a cyclobutylene group, a cyclopentylene group, a cyclohexylene group, a cyclooctylene group, and the like.

Examples of a group derived from the divalent alicyclic hydrocarbon group formed by two of $R^{13}$ include a group obtained by substituting at least one hydrogen atom of the divalent alicyclic hydrocarbon group with a linear, branched, or cyclic alkyl group having 1 to 4 carbon atoms, such as a methyl group, an ethyl group, an n-propyl group, an isopropyl group, an n-butyl group, a 2-methylpropyl group, a 1-methylpropyl group, or a t-butyl group, and the like.

The divalent alicyclic hydrocarbon group having 4 to 20 carbon atoms that is formed by two of $R^{13}$ together with the carbon atom that is bonded to the two $R^{13}$ (i.e., the carbon atom bonded to the oxygen atom) is preferably a divalent alicyclic hydrocarbon group such as a cyclopentylene group or a cyclohexylene group, a group obtained by substituting at least one hydrogen atom of the divalent alicyclic hydrocarbon group with any of the above alkyl groups, or the like.

Examples of the repeating unit (7) include repeating units shown by the following general formulas (7-1a) to (7-1g) and (7-2a), and the like.

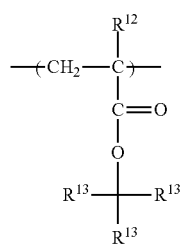

(7-1a)

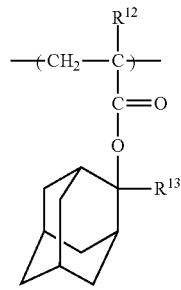

(7-1b)

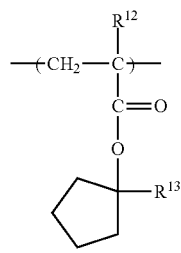

(7-1c)

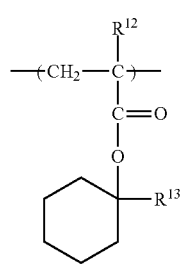

(7-1d)

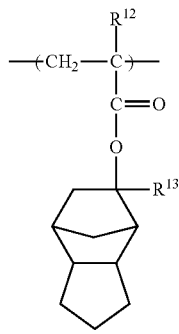

(7-1e)

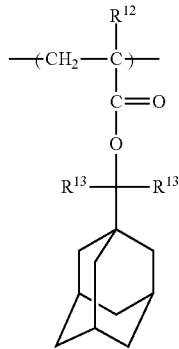

(7-1f)

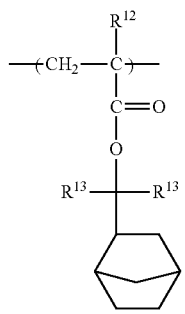

(7-1g)

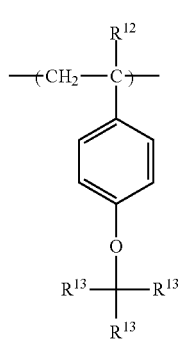

(7-2a)

wherein $R^{12}$ represents a hydrogen atom, a methyl group, a trifluoromethyl group, or a hydroxymethyl group, and $R^{13}$ individually represent a linear or branched alkyl group having 1 to 4 carbon atoms, a monovalent alicyclic hydrocarbon group having 4 to 20 carbon atoms, or a group derived therefrom, or two of $R^{13}$ bond to each other to form a divalent alicyclic hydrocarbon group having 4 to 20 carbon atoms, or a group derived therefrom, together with the carbon atom that is bonded to the two $R^{13}$, and the remainder of $R^{13}$ represents a linear or branched alkyl group having 1 to 4 carbon atoms, a monovalent alicyclic hydrocarbon group having 4 to 20 carbon atoms, or a group derived therefrom.

Note that the polymer (1) may include only one type of the repeating unit (7), or may include two or more types of the repeating units (7).

When the polymer (1) includes at least one of the repeating units (2) to (7) and (N), the upper limit of the total content of the repeating units (2) to (7) and (N) in the polymer (1) is preferably 99 mol %, more preferably 95 mol %, and still more preferably 90 mol %, based on the total amount (100 mol %) of the repeating units included in the polymer (1).

The polymer (1) that includes the repeating unit (1) is insoluble or scarcely soluble in an alkali, but becomes readily soluble in an alkali due to an acid. Therefore, the polymer (1) may suitably be used as an acid-labile group-containing polymer used for a radiation-sensitive composition.

When using the polymer (1) as an acid-labile group-containing polymer, the content of each repeating unit in the polymer (1) is adjusted as described below.

The content of the repeating unit (1) in the polymer (1) is preferably 1 mol % or more, more preferably 5 to 70 mol %, and still more preferably 5 to 50 mol %, based on the total amount (100 mol %) of the repeating units included in the polymer (1). If the content of the repeating unit (1) is 1 mol % or more, a radiation-sensitive composition that includes the polymer (1) produces a resist pattern that exhibits a small degree of nano edge roughness.

The total content of the repeating units (2) to (5) and (N) in the polymer (1) is preferably 1 mol % or more, more preferably 5 to 95 mol %, and still more preferably 5 to 95 mol %, based on the total amount (100 mol %) of the repeating units included in the polymer (1). If the total content of the repeating units (2) to (5) and (N) exceeds 95 mol %, a radiation-sensitive composition that includes the polymer (1) may not produce a resist pattern that exhibits a small degree of nano edge roughness.

The total content of the repeating units (1) to (5) and (N) in the polymer (1) is preferably 10 mol % or more, more preferably 40 to 100 mol %, and still more preferably 50 to 100 mol %, based on the total amount (100 mol %) of the repeating units included in the polymer (1). If the total content of the repeating units (1) to (5) and (N) is 10 mol % or more, a radiation-sensitive composition that includes the polymer (1) produces a resist pattern that exhibits a small degree of nano edge roughness.

The content of the repeating unit (6) in the polymer (1) is normally 80 mol % or less, and preferably 0 to 60 mol %, based on the total amount (100 mol %) of the repeating units included in the polymer (1). If the content of the repeating unit (6) is 80 mol % or less, a radiation-sensitive composition that includes the polymer (1) exhibits resolution and nano edge roughness in a well-balanced manner.

The content of the repeating unit (7) in the polymer (1) is normally 60 mol % or less, and preferably 0 to 50 mol %, based on the total amount (100 mol %) of the repeating units included in the polymer (1). If the content of the repeating unit (7) is 60 mol % or less, a radiation-sensitive composition that includes the polymer (1) exhibits resolution and nano edge roughness in a well-balanced manner.

The total content of the repeating units (6) and (7) in the polymer (1) is preferably 90 mol % or less, and more preferably 0 to 80 mol %, based on the total amount (100 mol %) of the repeating units included in the polymer (1). If the total content of the repeating units (6) and (7) is 90 mol % or less, a radiation-sensitive composition that includes the polymer (1) exhibits resolution and nano edge roughness in a particularly well-balanced manner.

The polymer (1) may be produced by an arbitrary method. The polymer (1) may be produced by radical polymerization or anionic polymerization using monomers (mixture) including the compound shown by the general formula (10). The polymer (1) that includes a hydroxystyrene unit in the side chain (e.g., repeating units (2) to (5)) may be obtained by hydrolyzing the resulting precursor polymer (e.g., acetoxy group) in an organic solvent in the presence of a base or an acid.

Radical polymerization may be implemented by stirring and heating the monomers (mixture) in an appropriate organic solvent under a nitrogen atmosphere in the presence of a radical initiator, for example.

Examples of the radical initiator include azo compounds such as 2,2'-azobisisobutylonitrile, 2,2'-azobis(2,4-dimethylvaleronitrile), 2,2'-azobis(4-methoxy-2,4-dimethylvaleronitrile), 2,2'-azobismethylbutyronitrile, 2,2'-azobiscyclohexanecarbonitrile, cyanomethylethylazoformamide, 2,2'-azobis(methyl 2,4-dimethylpropanate), and 2,2'-azobiscyanovaleric acid; organic peroxides such as benzoyl peroxide, lauroyl peroxide, 1,1'-bis(t-butylperoxy)cyclohexane, 3,5,5-trimethylhexanoyl peroxide, and t-butyl peroxy-2-ethylhexanoate; hydrogen peroxide; and the like.

A polymerization promoter such as 2,2,6,6-tetramethyl-1-piperidinyloxy, iodine, a mercaptan, or a styrene dimmer may optionally be used for radical polymerization.

The radical polymerization temperature is appropriately selected (e.g., 50 to 200° C.) depending on the type of radical initiator and the like. When using an azo initiator or an organic peroxide, the radical polymerization temperature is preferably determined so that the half-life of the initiator is about 10 minutes to about 30 hours (more preferably about 30 minutes to about 10 hours).

The radical polymerization time is adjusted depending on the type of initiator and the reaction temperature, but is preferably determined so that 50% or more of the initiator is consumed (generally about 0.5 to about 24 hours).

Anionic polymerization may be implemented by stirring the monomers (mixture) at a given temperature in an appropriate organic solvent under a nitrogen atmosphere in the presence of an anionic initiator, for example.

Examples of the anionic initiator include alkyllithium compounds such as n-butyllithium, s-butyllithium, t-butyllithium, ethyllithium, 1,1-diphenylhexyllithium, and 1,1-diphenyl-3-methylpentyllithium, and organic alkali metal compounds such as ethylsodium.

The anionic polymerization temperature is appropriately selected depending on the type of anionic initiator and the like. For example, when using an alkyllithium compound as the anionic initiator, the anionic polymerization temperature is preferably −100 to 50° C., and more preferably −78 to 30° C.

The anionic polymerization time is adjusted depending on the type of initiator and the reaction temperature, but is preferably determined so that 50% or more of the initiator is consumed (generally about 0.5 to about 24 hours).

Note that the polymer (1) may be produced without using an initiator. For example, the polymer (1) may be produced by polymerizing the monomers with heating, or subjecting the monomers to cationic polymerization.

The polymer (1) that includes a hydroxystyrene unit in the side chain (e.g., repeating units (2) to (5)) may be obtained by hydrolyzing an acetoxy group or the like. Examples of an acid used for hydrolysis include organic acids such as p-toluenesulfonic acid, a hydrate thereof, methanesulfonic acid, trifluoromethanesulfonic acid, malonic acid, oxalic acid, and 1,1,1-fluoroacetic acid; inorganic acids such as sulfuric acid, hydrochloric acid, phosphoric acid, and hydrobromic acid;

salts such as pyridinium p-toluenesulfonate, ammonium p-toluenesulfonate, and 4-methylpyridinium p-toluenesulfonate; and the like.

Examples of a base used for hydrolysis include inorganic bases such as potassium hydroxide, sodium hydroxide, sodium carbonate, and potassium carbonate; organic bases such as triethylamine, N-methyl-2-pyrrolidone, piperidine, and tetramethylammonium hydroxide; and the like.

Examples of the organic solvent used for polymerization or hydrolysis include ketones such as acetone, methyl ethyl ketone, and methyl amyl ketone; ethers such as diethyl ether and tetrahydrofuran (THF); alcohols such as methanol, ethanol, and propanol; aliphatic hydrocarbons such as hexane, heptane, and octane; aromatic hydrocarbons such as benzene, toluene, and xylene; alkyl halides such as chloroform, bromoform, methylene chloride, methylene bromide, and carbon tetrachloride; esters such as ethyl acetate, butyl acetate, ethyl lactate, propylene glycol monomethyl ether, propylene glycol monomethyl ether acetate, and cellosolve; aprotic polar solvents such as dimethylformamide, dimethyl sulfoxide, and hexamethylphosphoroamide; and the like.

Among these, acetone, methyl amyl ketone, methyl ethyl ketone, tetrahydrofuran, methanol, ethanol, propanol, ethyl acetate, butyl acetate, ethyl lactate, propylene glycol monomethyl ether, propylene glycol monomethyl ether acetate, and the like are preferable.

The polystyrene-reduced weight average molecular weight (hereinafter may be referred to as "Mw") of the polymer (1) determined by gel permeation chromatography (GPC) is preferably 2000 to 100,000, more preferably 2000 to 40,000, and still more preferably 2000 to 25,000.

The ratio (Mw/Mn) of the Mw to the polystyrene-reduced number average molecular weight (hereinafter may be referred to as "Mn") of the polymer (1) determined by GPC is normally 1 to 5, preferably 1 to 3, and more preferably 1 to 2.5.

2. Radiation-Sensitive Composition

A radiation-sensitive composition according to one embodiment of the invention includes (A) an acid-labile group-containing polymer, and (B) a photoacid generator, the acid-labile group-containing polymer (A) being the polymer (1).

2-1. Acid-Labile Group-Containing Polymer (A)

The acid-labile group-containing polymer (A) that is the polymer (1) is insoluble or scarcely soluble in an alkali, but becomes readily soluble in an alkali due to an acid. The polymer (1) preferably includes the repeating unit (1) and at least one repeating unit selected from the repeating units (2) to (7) and (N) (hereinafter referred to as "polymer (1-1)"). The expression "insoluble or scarcely soluble in an alkali" means that a film (thickness: 100 nm) that is formed only of the polymer (1-1) has a thickness equal to or more than 50% of the initial thickness when developed under alkaline development conditions employed when forming a resist pattern using a resist film that is formed of the radiation-sensitive composition according to one embodiment of the invention.

The radiation-sensitive composition according to one embodiment of the invention exhibits excellent sensitivity during a lithographic process due to the polymer (1-1). The radiation-sensitive composition can thus form a chemically-amplified positive-tone resist film that effectively responds to (extreme) deep ultraviolet rays (e.g., KrF excimer laser light, ArF excimer laser light, or EUV), X-rays such as synchrotron radiation, or electron beams during a lithographic process, exhibits a small degree of roughness, exhibits excellent sensitivity and resolution, and can stably and accurately form a fine pattern.

2-2. Photoacid Generator (B)

The photoacid generator (B) generates an acid within a film formed using the radiation-sensitive composition according to one embodiment of the invention when applying electron beams, radiation, or the like to the film during a lithographic process. The acid-labile group included in the polymer (1-1) dissociates due to the acid generated by the photoacid generator (B).

The photoacid generator (B) is preferably at least one compound selected from the group consisting of onium salts, diazomethane compounds, and sulfonimide compounds in order to achieve an excellent acid generation efficiency, heat resistance, and the like. These compounds may be used either individually or in combination.

The onium salt is preferably a compound shown by the following general formula (b1).

$$M^+Z^- \qquad (b1)$$

wherein $M^+$ represents a monovalent onium cation, and $Z^-$ represents a monovalent anion.

Examples of the onium salts include an iodonium salt, a sulfonium salt, a phosphonium salt, a diazonium salt, a pyridinium salt, and the like. Among these, a sulfonium salt and an iodonium salt are preferable due to excellent sensitivity.

The monovalent onium cation represented by $M^+$ is preferably a sulfonium cation or an iodonium cation.

Examples of the sulfonium cation include a cation shown by the following general formula (8-1).

$$R^{19}-\underset{\underset{R^{19}}{|}}{S^+}-R^{19} \qquad (8\text{-}1)$$

wherein $R^{19}$ individually represent a substituted or unsubstituted linear or branched alkyl group having 1 to 10 carbon atoms, or a substituted or unsubstituted aryl group having 6 to 18 carbon atoms, or two of $R^{19}$ bond to each other to form a cyclic structure together with the sulfur atom in the general formula (8-1), and the remainder of $R^{19}$ represents a substituted or unsubstituted linear or branched alkyl group having 1 to 10 carbon atoms, or a substituted or unsubstituted aryl group having 6 to 18 carbon atoms.

Examples of the iodonium cation include a cation shown by the following general formula (8-2).

$$R^{20}-I^+-R^{20} \qquad (8\text{-}2)$$

wherein $R^{20}$ individually represent a substituted or unsubstituted linear or branched alkyl group having 1 to 10 carbon atoms, or a substituted or unsubstituted aryl group having 6 to 18 carbon atoms, or bond to each other to form a cyclic structure together with the iodine atom in the general formula (8-2).

The monovalent onium cation represented by $M^+$ may be produced by the method described in Advances in Polymer Science, vol. 62, pp. 1-48 (1984), for example.

Examples of the monovalent anion represented by $Z^-$ include anions shown by the following general formulas (9-1) to (9-4).

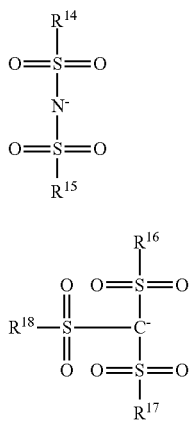

(9-1)

(9-2)

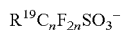
(9-3)

(9-4)

wherein $R^{14}$ and $R^{15}$ individually represent an alkyl group having 1 to 20 carbon atoms that is substituted with at least one fluorine atom, or bond to each other to form a cyclic structure having 1 to 20 carbon atoms that is substituted with at least one fluorine atom, and $R^{16}$, $R^{17}$, and $R^{18}$ individually represent an alkyl group having 1 to 20 carbon atoms that is substituted with at least one fluorine atom, or two of $R^{16}$, $R^{17}$, and $R^{18}$ bond to each other to form a cyclic structure having 1 to 20 carbon atoms that is substituted with at least one fluorine atom, and the remainder of $R^{16}$, $R^{17}$, and $R^{18}$ represents an alkyl group having 1 to 20 carbon atoms that is substituted with at least one fluorine atom, $R^{19}$ represents a fluorine atom or a substituted or unsubstituted hydrocarbon group having 1 to 12 carbon atoms, n is an integer from 1 to 10, and $R^{20}$ represents a fluorine atom or a substituted or unsubstituted hydrocarbon group having 1 to 12 carbon atoms.

Examples of the onium salt include triphenylsulfonium trifluoromethanesulfonate, triphenylsulfonium nonafluoro-n-butanesulfonate, triphenylsulfonium benzenesulfonate, triphenylsulfonium 10-camphorsulfonate, triphenylsulfonium n-octanesulfonate, triphenylsulfonium 4-trifluoromethylbenzensulfonate, triphenylsulfonium naphthalenesulfonate, triphenylsulfonium perfluorobenzenesulfonate, triphenylsulfonium 1,1,2,2-tetrafluoro-2-(tetracyclo[4.4.0.1$^{2,5}$.1$^{7,10}$]dodecan-8-yl)ethanesulfonate, triphenylsulfonium 1,1-difluoro-2-(bicyclo[2.2.1]heptan-2-yl)ethanesulfonate, (4-t-butoxyphenyl)diphenylsulfonium trifluoromethanesulfonate, (4-t-butoxyphenyl)diphenylsulfonium nonafluoro-n-butanesulfonate, (4-t-butoxyphenyl)diphenylsulfonium perfluoro-n-octanesulfonate, (4-t-butoxyphenyl)diphenylsulfonium 10-camphorsulfonate, (4-hydroxyphenyl)diphenylsulfonium trifluoromethanesulfonate, (4-hydroxyphenyl)diphenylsulfonium nonafluoro-n-butanesulfonate, (4-hydroxyphenyl)diphenylsulfonium perfluoro-n-octanesulfonate, (4-hydroxyphenyl)diphenylsulfonium 10-camphorsulfonate, (4-hydroxyphenyl)diphenylsulfonium n-octanesulfonate, tris(4-methoxyphenyl)sulfonium trifluoromethanesulfonate, tris(4-methoxyphenyl)sulfonium nonafluoro-n-butanesulfonate, tris(4-methoxyphenyl)sulfonium perfluoro-n-octanesulfonate, tris(4-methoxyphenyl)sulfonium 10-camphorsulfonate, (4-fluorophenyl)diphenylsulfonium trifluoromethanesulfonate, (4-fluorophenyl)diphenylsulfonium nonafluoro-n-butanesulfonate, (4-fluorophenyl)diphenylsulfonium 10-camphorsulfonate; tris(4-fluorophenyl)sulfonium trifluoromethanesulfonate, tris(4-fluorophenyl)sulfonium nonafluoro-n-butanesulfonate, tris(4-fluorophenyl)sulfonium 10-camphorsulfonate, tris(4-fluorophenyl)sulfonium p-toluenesulfonate, tris(4-trifluoromethylphenyl)sulfonium trifluoromethanesulfonate, 2,4,6-trimethylphenyldiphenylsulfonium trifluoromethanesulfonate, 2,4,6-trimethylphenyldiphenylsulfonium 2,4-di fluorobenzenesulfonate, 2,4,6-trimethylphenyldiphenylsulfonium 4-trifluoromethylbenzensulfonate; diphenyliodonium trifluoromethanesulfonate, diphenyliodonium nonafluoro-n-butanesulfonate, diphenyliodonium perfluoro-n-octanesulfonate, diphenyliodonium 10-camphorsulfonate, diphenyliodonium n-octanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 10-camphorsulfonate, bis(4-t-butylphenyl)iodonium n-octanesulfonate, (4-methoxyphenyl)phenyliodonium trifluoromethanesulfonate, (4-methoxyphenyl)phenyliodonium nonafluoro-n-butanesulfonate, (4-methoxyphenyl)phenyliodonium perfluoro-n-octanesulfonate, (4-fluorophenyl)phenyliodonium trifluoromethanesulfonate, (4-fluorophenyl)phenyliodonium nonafluoro-n-butanesulfonate, (4-fluorophenyl)phenyliodonium 10-camphorsulfonate; bis(4-fluorophenyl)iodonium trifluoromethanesulfonate, bis(4-fluorophenyl)iodonium nonafluoro-n-butanesulfonate, bis(4-fluorophenyl)iodonium 10-camphorsulfonate, bis(4-chlorophenyl)iodonium trifluoromethanesulfonate, bis(4-chlorophenyl)iodonium nonafluoro-n-butanesulfonate, bis(4-chlorophenyl)iodonium perfluoro-n-octanesulfonate, bis(4-chlorophenyl)iodonium-n-dodecylbenzenesulfonate, bis(4-chlorophenyl)iodonium 10-camphorsulfonate, bis(4-chlorophenyl)iodonium n-octanesulfonate, bis(4-chlorophenyl)iodonium 4-trifluoromethylbenzensulfonate, bis(4-chlorophenyl)iodonium perfluorobenzenesulfonate, bis(4-trifluoromethylphenyl)iodonium trifluoromethanesulfonate, bis(4-trifluoromethylphenyl)iodonium nonafluoro-n-butanesulfonate, bis(4-trifluoromethylphenyl)iodonium perfluoro-n-octanesulfonate, bis(4-trifluoromethylphenyl)iodonium n-dodecylbenzenesulfonate, bis(4-trifluoromethylphenyl)iodonium p-toluenesulfonate, bis(4-trifluoromethylphenyl)iodonium benzenesulfonate, bis(4-trifluoromethylphenyl)iodonium 10-camphorsulfonate, bis(4-trifluoromethylphenyl)iodonium n-octanesulfonate, bis(4-trifluoromethylphenyl)iodonium 4-trifluoromethylbenzensulfonate, bis(4-trifluoromethylphenyl)iodonium perfluorobenzenesulfonate, the compounds shown by the following formulas (2x-1) to (2x-42), and the like.

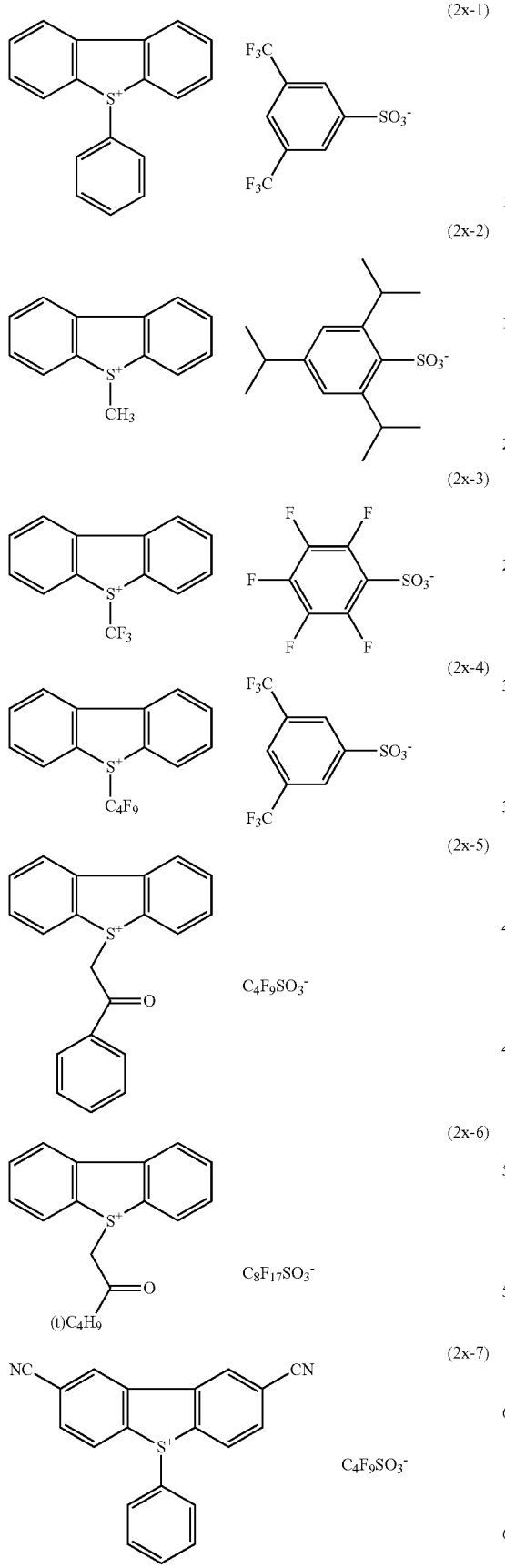
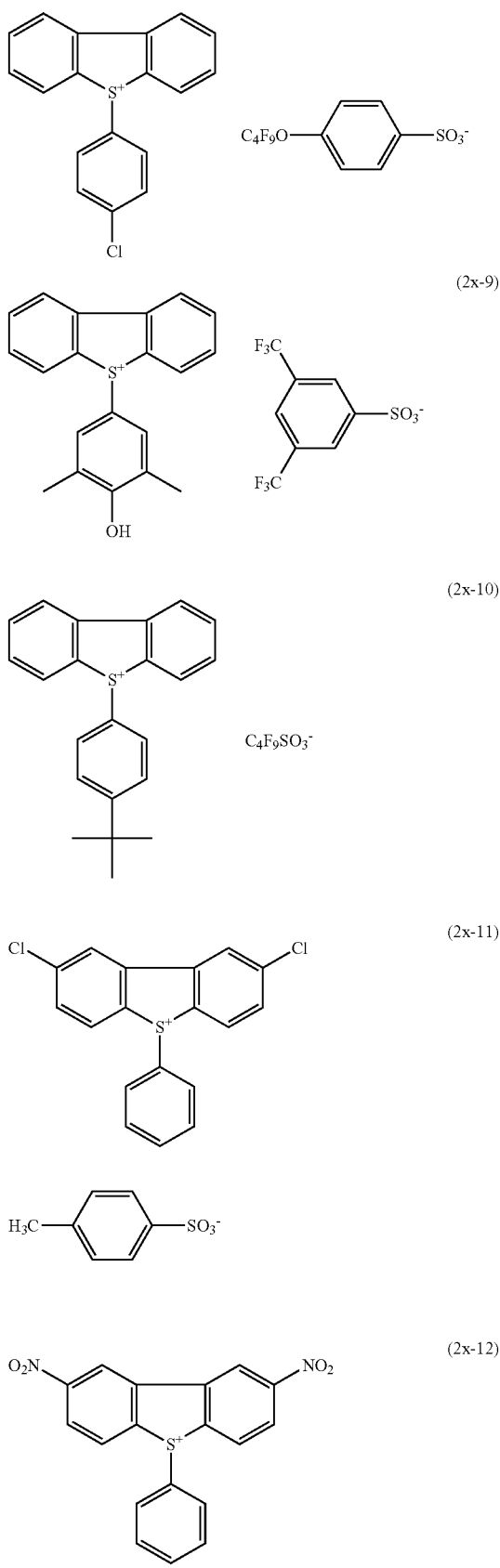

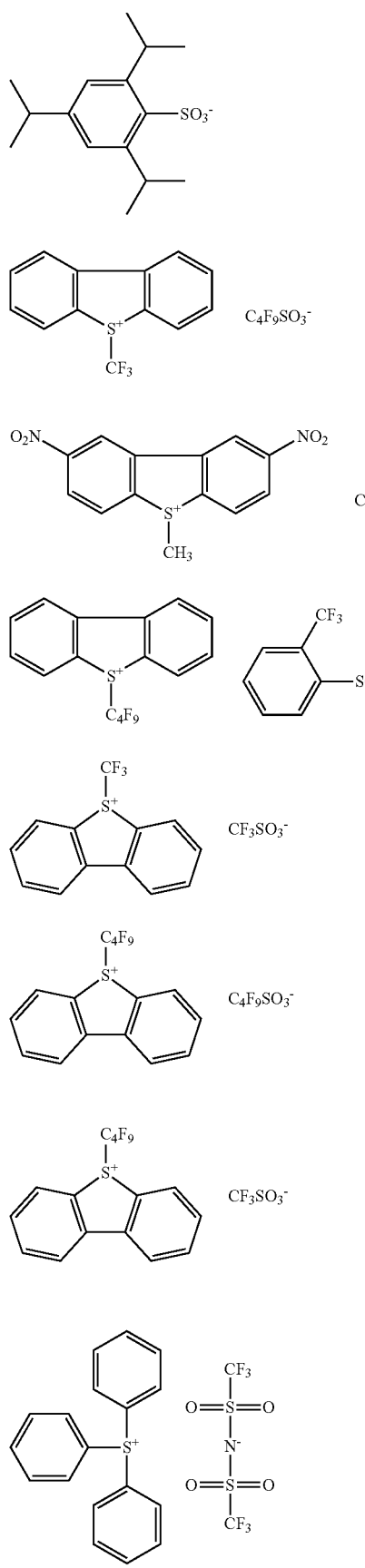
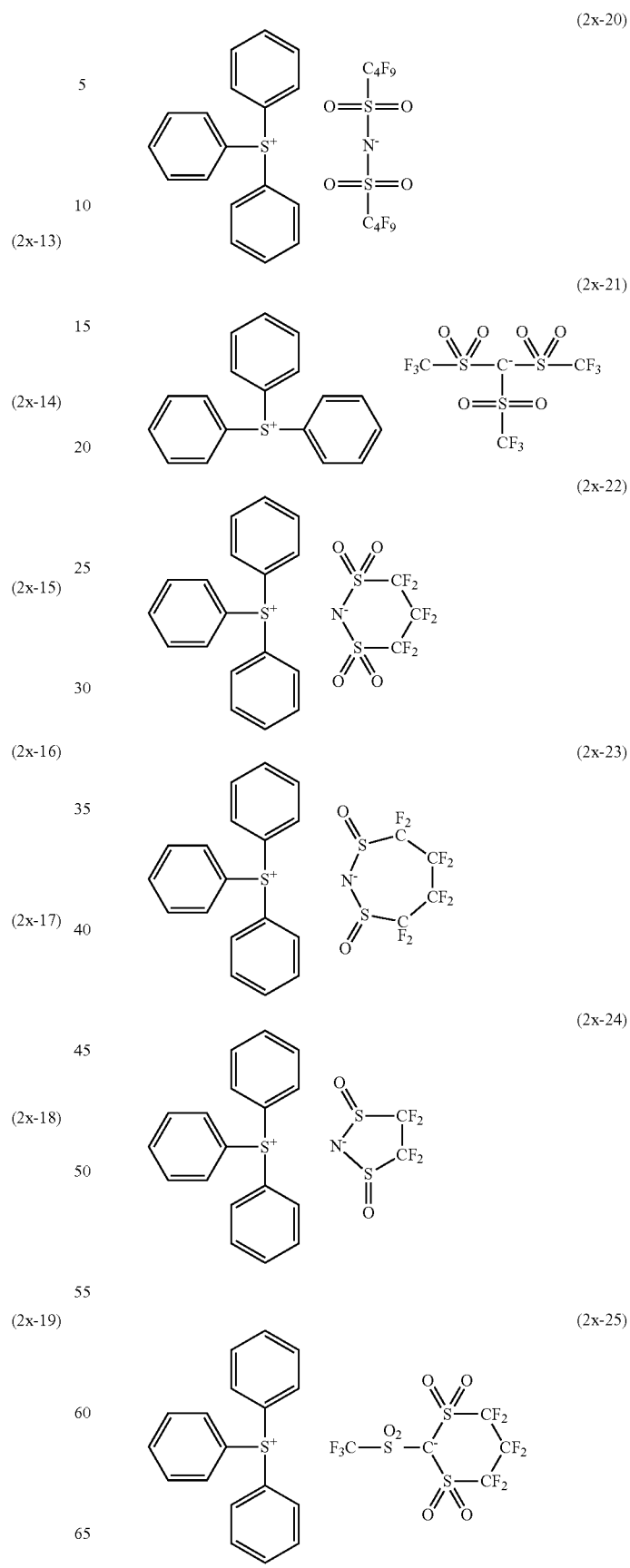

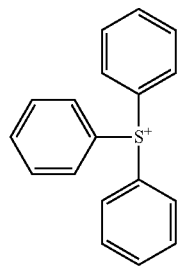 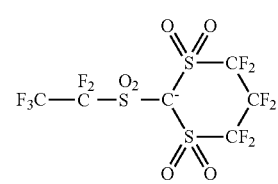 (2x-26)
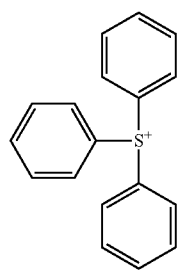 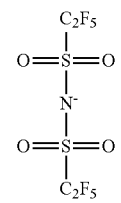 (2x-27)
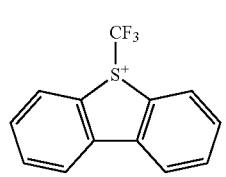 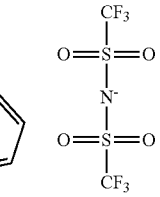 (2x-28)
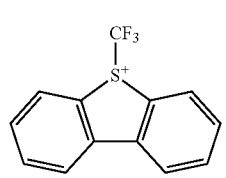 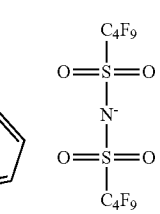 (2x-29)
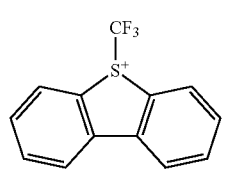 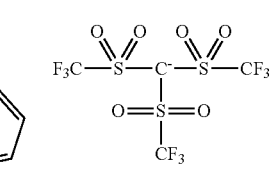 (2x-30)
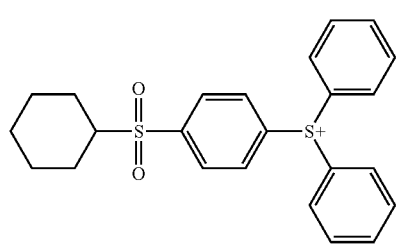 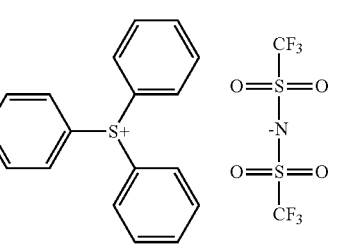 (2x-31)
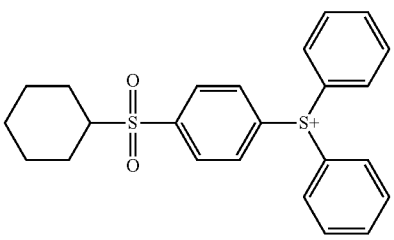 (2x-32)
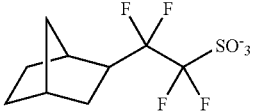
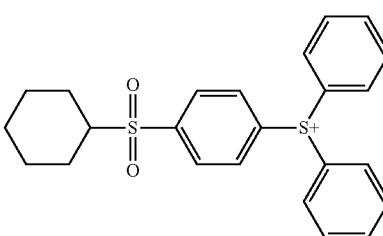 (2x-33)
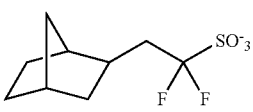
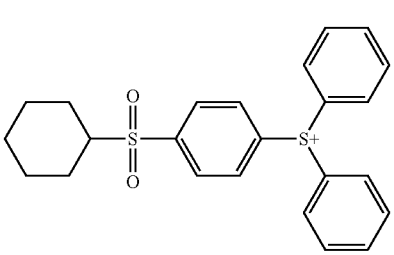 (2x-34)
 (2x-35)
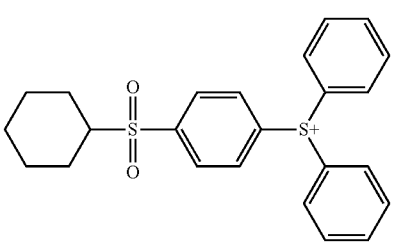
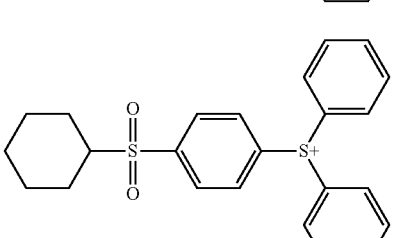 (2x-36)
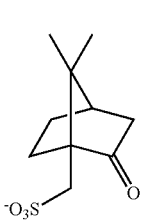

-continued (2x-37)
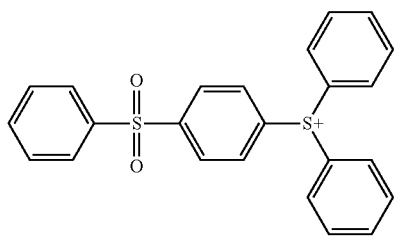

(2x-38)
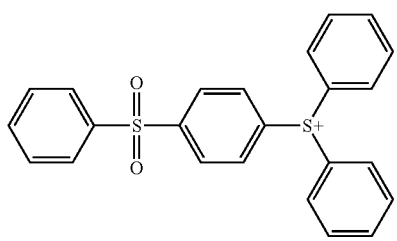

(2x-39)
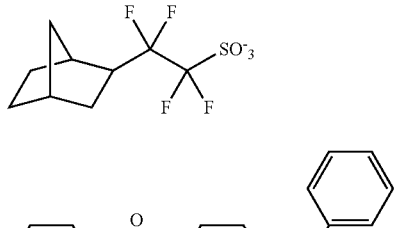

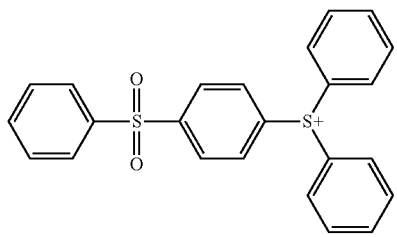

(2x-40)
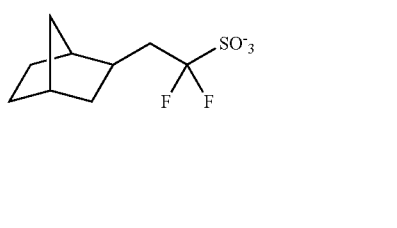

(2x-41)
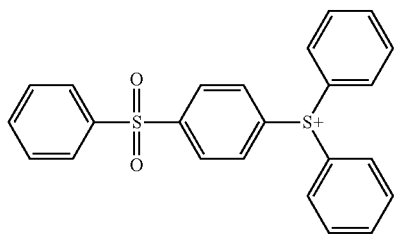

-continued (2x-42)
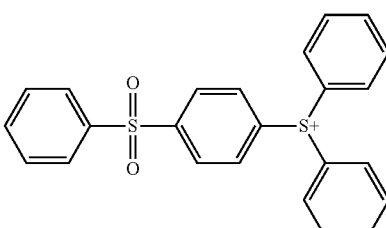

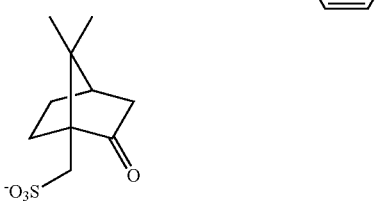

These onium salts may be used either individually or in combination.

Among these, triphenylsulfonium trifluoromethanesulfonate, triphenylsulfonium nonafluoro-n-butanesulfonate, triphenylsulfonium 10-camphorsulfonate, (4-hydroxyphenyl)diphenylsulfonium trifluoromethanesulfonate, (4-hydroxyphenyl)diphenylsulfonium nonafluoro-n-butanesulfonate, tris(4-methoxyphenyl)sulfonium trifluoromethanesulfonate, tris(4-methoxyphenyl)sulfonium nonafluoro-n-butanesulfonate, (4-fluorophenyl)diphenylsulfonium trifluoromethanesulfonate, (4-fluorophenyl)diphenylsulfonium nonafluoro-n-butanesulfonate, 2,4,6-trimethylphenyldiphenylsulfonium trifluoromethanesulfonate, 2,4,6-trimethylphenyldiphenylsulfonium 2,4-difluorobenzenesulfonate, 2,4,6-trimethylphenyldiphenylsulfonium 4-trifluoromethylbenzenesulfonate, diphenyliodonium trifluoromethanesulfonate, diphenyliodonium nonafluoro-n-butanesulfonate, diphenyliodonium 10-camphorsulfonate, bis(4-t-butylphenyl)iodonium trifluoromethanesulfonate, bis(4-t-butylphenyl)iodonium nonafluoro-n-butanesulfonate, bis(4-t-butylphenyl)iodonium 10-camphorsulfonate, (4-fluorophenyl)phenyliodonium trifluoromethanesulfonate, (4-fluorophenyl)phenyliodonium nonafluoro-n-butanesulfonate, (4-fluorophenyl)phenyliodonium 10-camphorsulfonate, bis(4-fluorophenyl)iodonium trifluoromethanesulfonate, bis(4-fluorophenyl)iodonium nonafluoro-n-butanesulfonate, bis(4-fluorophenyl)iodonium 10-camphorsulfonate, tris(4-trifluoromethylphenyl)sulfonium trifluoromethanesulfonate, triphenylsulfonium 1,1,2,2-tetrafluoro-2-(tetracyclo[4.4.0.1$^{2,5}$.1$^{7,10}$]dodecan-8-yl)ethanesulfonate, triphenylsulfonium 1,1-difluoro-2-(bicyclo[2.2.1]heptan-2-yl)ethanesulfonate, and the compounds shown by the formulas (2x-13), (2x-16), (2x-17), (2x-18), (2x-19), (2x-20), (2x-27), (2x-28), (2x-29), (2x-31), and (2x-36) are preferable.

Examples of the diazomethane compounds include bis(trifluoromethanesulfonyl)diazomethane, bis(cyclohexylsulfonyl)diazomethane, bis(3,3-dimethyl-1,5-dioxaspiro[5.5]dodecane-8-sulfonyl)diazomethane, bis(1,4-dioxaspiro[4.5]decane-7-sulfonyl)diazomethane, bis(t-butylsulfonyl)diazomethane, and the like.

These diazomethane compounds may be used either individually or in combination.

Among these, bis(cyclohexylsulfonyl)diazomethane, bis(3,3-dimethyl-1,5-dioxaspiro[5.5]dodecane-8-sulfonyl)diazomethane, and bis(1,4-dioxaspiro[4.5]decane-7-sulfonyl)diazomethane are preferable.

Examples of the sulfonimide compounds include N-(trifluoromethylsulfonyloxy)bicyclo[2.2.1]hept-5-ene-2,3-dicarboxyimide, N-(trifluoromethylsulfonyloxy)-7-oxabicyclo[2.2.1]hept-5-ene-2,3-dicarboxyimide, N-(trifluoromethylsulfonyloxy)bicyclo[2.2.1]heptan-5,6-oxy-2,3-dicarboxyimide; N-(10-camphorsulfonyloxy)succinimide, N-(10-camphorsulfonyloxy)phthalimide, N-(10-camphorsulfonyloxy)-7-oxabicyclo[2.2.1]hept-5-ene-2,3-dicarboxyimide, N-(10-camphorsulfonyloxy)bicyclo[2.2.1]heptan-5,6-oxy-2,3-dicarboxyimide, N-(10-camphorsulfonyloxy)naphthylimide, N-[(5-methyl-5-carboxymethylbicyclo[2.2.1]heptan-2-yl)sulfonyloxy]succinimide, N-(n-octylsulfonyloxy)bicyclo[2.2.1]kept-5-ene-2,3-dicarboxyimide, N-(n-octylsulfonyloxy)bicyclo[2.2.1]heptan-5,6-oxy-2,3-dicarboxyimide, N-(perfluorophenylsulfonyloxy)bicyclo[2.2.1]hept-5-ene-2,3-dicarboxyimide, N-(perfluorophenylsulfonyloxy)-7-oxabicyclo[2.2.1]hept-5-ene-2,3-dicarboxyimide, N-(perfluorophenylsulfonyloxy)bicyclo[2.2.1]heptan-5,6-oxy-2,3-dicarboxyimide, N-(nonafluoro-n-butylsulfonyloxy)bicyclo[2.2.1]hept-5-ene-2,3-dicarboxyimide, N-(nonafluoro-n-butylsulfonyloxy)-7-oxabicyclo[2.2.1]hept-5-ene-2,3-dicarboxyimide, N-(nonafluoro-n-butylsulfonyloxy)bicyclo[2.2.1]heptan-5,6-oxy-2,3-dicarboxyimide, N-(perfluoro-n-octylsulfonyloxy)bicyclo[2.2.1]hept-5-ene-2,3-dicarboxyimide, N-(perfluoro-n-octylsulfonyloxy)-7-oxabicyclo[2.2.1]hept-5-ene-2,3-dicarboxyimide, N-(perfluoro-n-octylsulfonyloxy)bicyclo[2.2.1]heptan-5,6-oxy-2,3-dicarboxyimide, and the like.

These sulfonimide compounds may be used either individually or in combination.

Among these, N-(trifluoromethylsulfonyloxy)bicyclo[2.2.1]hept-5-ene-2,3-dicarboxyimide, N-(10-camphorsulfonyloxy)succinimide, and N-[(5-methyl-5-carboxymethylbicyclo[2.2.1]heptan-2-yl)sulfonyloxy]succinimide are preferable.

The photoacid generator (B) is preferably used in the radiation-sensitive composition in an amount of 0.1 to 50 parts by mass, and more preferably 0.5 to 50 parts by mass, based on 100 parts by mass of the acid-labile group-containing polymer (A). If the amount of the photoacid generator (B) is less than 0.1 parts by mass, the sensitivity and the developability of the radiation-sensitive composition may deteriorate. If the amount of the photoacid generator (B) exceeds 50 parts by mass, the transparency to radiation, the pattern shape, the heat resistance, and the like may deteriorate.

2-3. Acid Diffusion Controller

The radiation-sensitive composition according to one embodiment of the invention preferably further includes an acid diffusion controller (hereinafter referred to as "acid diffusion controller (C)") in addition to the acid-labile group-containing polymer (A) and the photoacid generator (B).

The acid diffusion controller (C) controls a phenomenon in which an acid generated by the photoacid generator (B) is diffused upon exposure within a resist film formed using the composition according to one embodiment of the invention, and suppresses undesired chemical reactions in the unexposed area.

The acid diffusion controller (C) improves the storage stability of the resulting radiation-sensitive composition, and sufficiently improves the resolution of the resulting resist film. Moreover, the acid diffusion controller (C) suppresses a change in line width of the resist pattern due to a change in post-exposure delay (PED) from exposure, so that a radiation-sensitive composition that exhibits remarkably superior process stability can be obtained.

Examples of the acid diffusion controller (C) include nitrogen-containing organic compounds, photosensitive basic compounds, and the like. These compounds may be used either individually or in combination.

Examples of the nitrogen-containing organic compounds include a compound shown by the following general formula (12) (hereinafter referred to as "nitrogen-containing compound (i)"), a compound that includes two nitrogen atoms in the molecule (hereinafter referred to as "nitrogen-containing compound (ii)"), a polyamino compound or a polymer that includes three or more nitrogen atoms (hereinafter collectively referred to as "nitrogen-containing compound (iii)"), an amide group-containing compound, a urea compound, a nitrogen-containing heterocyclic compound, and the like. These compounds may be used either individually or in combination.

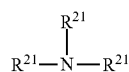

(12)

wherein $R^{21}$ individually represent a hydrogen atom, a substituted or unsubstituted linear, branched or cyclic alkyl group, a substituted or unsubstituted aryl group, or a substituted or unsubstituted aralkyl group.

Examples of the nitrogen-containing compound (i) include mono(cyclo)alkylamines such as n-hexylamine, n-heptylamine, n-octylamine, n-nonylamine, n-decylamine, and cyclohexylamine; di(cyclo)alkylamines such as di-n-butylamine, di-n-pentylamine, di-n-hexylamine, di-n-heptylamine, di-n-octylamine, di-n-nonylamine, di-n-decylamine, cyclohexylmethylamine, and dicyclohexylamine; tri(cyclo)alkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, methyldicyclohexylamine, and tricyclohexylamine; and substituted alkylamines such as triethanolamine; aromatic amines such as aniline, N-methylaniline, N,N-dimethylaniline, 2-methylaniline, 3-methylaniline, 4-methylaniline, 4-nitroaniline, diphenylamine, triphenylamine, naphthylamine, 2,4,6-tri-tert-butyl-N-methylaniline, N-phenyldiethanolamine, and 2,6-diisopropylaniline; and the like. These nitrogen-containing compounds (i) may be used either individually or in combination.

Examples of the nitrogen-containing compound (ii) include ethylenediamine, N,N,N',N'-tetramethylethylenediamine, tetramethylenediamine, hexamethylenediamine, 4,4'-diaminodiphenylmethane, 4,4'-diamino diphenyl ether, 4,4'-diaminobenzophenone, 4,4'-diaminodiphenylamine, 2,2'-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, bis(2-dimethylaminoethyl)ether, bis(2-diethylaminoethyl)ether, 1-(2-hydroxyethyl)-2-imidazolizinone, 2-quinoxalinol, N,N,N',N'-tetrakis(2-hydroxypropyl)ethylenediamine, N,N,N',N'',N''-pentamethyldiethylenetriamine, and the like. These nitrogen-containing compounds (ii) may be used either individually or in combination.

Examples of the nitrogen-containing compound (iii) include polyethyleneimine, polyallylamine, poly(2-dimethylaminoethylacrylamide), and the like. These nitrogen-containing compounds (iii) may be used either individually or in combination.

Examples of the amide group-containing compounds include N-t-butoxycarbonyl group-containing amino compounds such as N-t-butoxycarbonyl di-n-octylamine, N-t-butoxycarbonyl di-n-nonylamine, N-t-butoxycarbonyl di-n-decylamine, N-t-butoxycarbonyl dicyclohexylamine, N-t-butoxycarbonyl-1-adamantylamine, N-t-butoxycarbonyl-2-adamantylamine, N-t-butoxycarbonyl-N-methyl-1-adamantylamine, (S)-(−)-1-(t-butoxycarbonyl)-2-pyrrolidinemethanol, (R)-(+)-1-(t-butoxycarbonyl)-2-pyrrolidinemethanol, N-t-butoxycarbonyl-4-hydroxypiperidine, N-t-butoxycarbonylpyrrolidine, N-t-butoxycarbonylpiperazine, N,N-di-t-butoxycarbonyl-1-adamantylamine, N,N-di-t-butoxycarbonyl-N-methyl-1-adamantylamine, N-t-butoxycarbonyl-4,4'-diaminodiphenylmethane, N,N'-di-t-butoxycarbonylhexamethylenediamine, N,N,N'N'-tetra-t-butoxycarbonylhexamethylenediamine, N,N'-di-t-butoxycarbonyl-1,7-diaminoheptane, N,N'-di-t-butoxycarbonyl-1,8-diaminonooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methyl benzimidazole, and N-t-butoxycarbonyl-2-phenylbenzimidazole, formamide, N-methylformamide, N,N-dimethylformamide, acetamide, N-methylacetamide, N,N-dimethylacetamide, propionamide, benzamide, pyrrolidone, N-methylpyrrolidone, N-acetyl-1-adamantylamine, tris(2-hydroxyethyl)isocyanurate, and the like. These amide group-containing compounds may be used either individually or in combination.

Examples of the urea compounds include urea, methylurea, 1,1-dimethylurea, 1,3-dimethylurea, 1,1,3,3-tetramethylurea, 1,3-diphenyl urea, tri-n-butylthiourea, and the like. These urea compounds may be used either individually or in combination.

Examples of the nitrogen-containing heterocyclic compounds include imidazoles such as imidazole, 4-methyl imidazole, 4-methyl-2-phenyl imidazole, benzimidazole, 2-phenylbenzimidazole, 1-benzyl-2-methylimidazole, and 1-benzyl-2-methyl-1H-imidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinamide, quinoline, 4-hydroxyquinoline, 8-oxyquinoline, acridine, and 2,2':6',2''-terpyridine, piperazines such as piperazine, 1-(2'-hydroxyethyl)piperazine, pyrazine, pyrazole, pyridazine, quinoxaline, purine, pyrrolidine, piperidine, piperidine ethanol, 3-piperidino-1,2-propanediol, morpholine, 4-methylmorpholine, 1-(4-morpholinyl)ethanol, 4-acetylmorpholine, 3-(N-morpholino)-1,2-propanediol, 1,4-dimethylpiperazine, 1,4-diazabicyclo[2.2.2]octane, and the like. These nitrogen-containing heterocyclic compounds may be used either individually or in combination.

The photosensitive basic compound is decomposed and loses basicity in the exposed area, but remains undecomposed in the unexposed area. The photosensitive basic compound can effectively utilize an acid generated in the exposed area, and can thus improve sensitivity as compared with a non-photosensitive basic compound.

Examples of the photosensitive basic compound include compounds shown by the following general formulas (14-1) and (14-2), and the like.

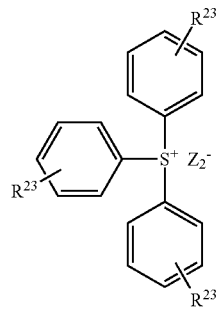

(14-1)

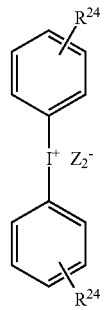

(14-2)

wherein $R^{23}$ individually represent a hydrogen atom, a halogen atom, a substituted or unsubstituted alkyl group having 1 to 10 carbon atoms, a substituted or unsubstituted alicyclic hydrocarbon group, an $—OSO_2—R^{25}$ group, or an $—SO_2—R^{25}$ group, $R^{25}$ represents a substituted or unsubstituted alkyl group having 1 to 10 carbon atoms, a substituted or unsubstituted alicyclic hydrocarbon group, or a substituted or unsubstituted aryl group, $R^{24}$ individually represent a hydrogen atom, a halogen atom, a substituted or unsubstituted alkyl group having 1 to 10 carbon atoms, a substituted or unsubstituted alicyclic hydrocarbon group, an $—OSO_2—R^{26}$ group, or an $—SO_2—R^{26}$ group, $R^{26}$ represents a substituted or unsubstituted alkyl group having 1 to 10 carbon atoms, a substituted or unsubstituted alicyclic hydrocarbon group, or a substituted or unsubstituted aryl group, $Z_2^-$ represents $OH^-$, $R^{27}O^-$, or $R^{27}COO^-$, and $R^{27}$ represents a monovalent organic group.

$R^{23}$ and $R^{24}$ preferably represent a hydrogen atom or a t-butyl group. Note that $R^{23}$ in the general formula (14-1) may be either the same or different, and $R^{24}$ in the general formula (14-2) may be either the same or different.

$Z_2^-$ in the general formulas (14-1) and (14-2) represents $OH^-$, $R^{27}O^-$, or $R^{27}COO^-$ (wherein $R^{27}$ represents a monovalent organic group).

Examples of the monovalent organic group represented by $R^{27}$ include a substituted or unsubstituted alkyl group, a substituted or unsubstituted aryl group, and the like.

$Z_2^-$ preferably represents $OH^-$, $CH_3COO^-$, or any of the ions shown by the following formulas (15-1) to (15-5).

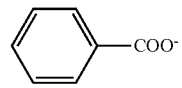

(15-1)

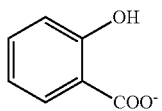
(15-2)

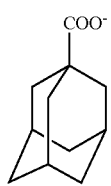
(15-3)

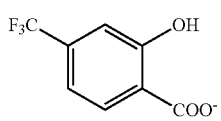
(15-4)

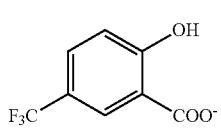
(15-5)

Examples of the photosensitive basic compound include a triphenylsulfonium compound shown by the general formula (14-1) wherein the anion moiety ($Z_2^-$) is $OH^-$, $CH_3COO^-$, or the ion shown by the formula (15-2) or (15-3), and the like.

The acid diffusion controller (C) is preferably used in the radiation-sensitive composition in an amount of 30 parts by mass or less, more preferably 0.001 to 30 parts by mass, and still more preferably 0.005 to 15 parts by mass, based on 100 parts by mass of the acid-labile group-containing polymer (A). If the amount of the acid diffusion controller (C) is too large, the sensitivity of the resulting resist film or the developability of the exposed area may deteriorate. If the amount of the acid diffusion controller (C) is too small, the pattern shape or the dimensional accuracy of the resulting resist film may deteriorate depending on the process conditions.

2-4. Additional Component

The radiation-sensitive composition according to one embodiment of the invention is preferably prepared by dissolving the acid-labile group-containing polymer (A), the photoacid generator (B), and the acid diffusion controller (C) in a solvent. Specifically, the radiation-sensitive composition preferably includes a solvent as an additional component.

The radiation-sensitive composition according to one embodiment of the invention may optionally include an additive such as a surfactant, a sensitizer, or an aliphatic additive.

Examples of the solvent include linear or branched ketones, cyclic ketones, propylene glycol monoalkyl ether acetates, alkyl 2-hydroxypropionates, alkyl 3-alkoxypropionates, γ-butyrolactone, and the like. These compounds may be used either individually or in combination.

The solvent is preferably used so that the total solid content of the radiation-sensitive composition is 1 to 70 mass %, more preferably 1 to 15 mass %, and still more preferably 1 to 10 mass %.

The surfactant improves the applicability, striation, developability, and the like of the radiation-sensitive composition.

Examples of the surfactant include nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate, and polyethylene glycol distearate, commercially available products such as KP341 (manufactured by Shin-Etsu Chemical Co., Ltd.), Polyflow No. 75, Polyflow No. 95 (manufactured by Kyoeisha Chemical Co., Ltd.), EFTOP EF301, EFTOP EF303, EFTOP EF352 (manufactured by JEMCO, Inc.), Megafac F171, Megafac F173 (manufactured by DIC Corporation), Fluorad FC430, Fluorad FC431 (manufactured by Sumitomo 3M Ltd.), Asahi Guard AG710, Surflon S-382, Surflon SC-101, Surflon SC-102, Surflon SC-103, Surflon SC-104, Surflon SC-105, Surflon SC-106 (manufactured by Asahi Glass Co., Ltd.), and the like. These surfactants may be used either individually or in combination.

The surfactant is preferably used in the radiation-sensitive composition in an amount of 0.001 to 2 parts by mass based on 100 parts by mass of the acid-labile group-containing polymer (A).

The sensitizer absorbs the energy of radiation, and transmits the energy to the photoacid generator (B) so that the amount of acid generated increases. Specifically, the sensitizer improves the apparent sensitivity of the radiation-sensitive composition.

Examples of the sensitizer include carbazoles, acetophenones, benzophenones, naphthalenes, phenols, biacetyl, cosine, rose bengal, pyrenes, anthracenes, phenothiazines, and the like. These sensitizers may be used either individually or in combination.

The sensitizer is preferably used in the radiation-sensitive composition in an amount of 0.1 to 10 parts by mass based on 100 parts by mass of the acid-labile group-containing polymer (A).

The alicyclic additive further improves the dry etching resistance, the pattern shape, the adhesion to a substrate, and the like.

Examples of the alicyclic additives include adamantane derivatives such as 1-adamantanecarboxylic acid, 2-adamantanone, t-butyl-1-adamantanecarboxylate, t-butoxycarbonylmethyl 1-adamantanecarboxylate, α-butyrolactone 1-adamantanecarboxylate, di-t-butyl 1,3-adamantanedicarboxylate, t-butyl 1-adamantaneacetate, t-butoxycarbonylmethyl 1-adamantaneacetate, di-t-butyl 1,3-adamantanediacetate, and 2,5-dimethyl-2,5-di(adamantylcarbonyloxy)hexane, deoxycholates such as t-butyl deoxycholate, t-butoxycarbonylmethyl deoxycholate, 2-ethoxyethyl deoxycholate, 2-cyclohexyloxyethyl deoxycholate, 3-oxocyclohexyl deoxycholate, tetrahydropyranyl deoxycholate, and mevalonolactone deoxycholate, lithocholates such as t-butyl lithocholate, t-butoxycarbonylmethyl lithocholate, 2-ethoxyethyl lithocholate, 2-cyclohexyloxyethyl lithocholate, 3-oxocyclohexyl lithocholate, tetrahydropyranyl lithocholate, and mevalonolactone lithocholate, alkyl carboxylates such as dimethyl adipate, diethyl adipate, dipropyl adipate, di-n-butyl adipate, and di-t-butyl adipate, 3-[2-hydroxy-2,2-bis(trifluoromethyl)ethyl]tetracyclo[4.4.0.1$^{2,5}$.1$^{7,10}$]dodecane, and the like. These alicyclic additives may be used either individually or in combination.

The alicyclic additive is preferably used in the radiation-sensitive composition in an amount of 0.5 to 20 parts by mass based on 100 parts by mass of the acid-labile group-containing polymer (A). If the amount of the alicyclic additive is too large, the heat resistance of the resulting resist film may deteriorate.

Examples of further additives include an alkali-soluble resin, a low-molecular-weight alkali solubility controller that includes an acid-labile protecting group, a halation inhibitor, a preservation stabilizer, an anti-foaming agent, and the like.

A dye or a pigment visualizes the latent image in the exposed area, and reduces the effects of halation during exposure. An adhesion improver improves the adhesion of the resist film to a substrate.

The radiation-sensitive composition may be prepared by homogeneously dissolving the polymer (A), the photoacid generator (B), the acid diffusion controller (C), and an optional additional component (excluding the solvent) in the solvent so that the total solid content is within the above range. The radiation-sensitive composition thus prepared is preferably filtered through a filter having a pore size of about 0.2 μm, for example.

3. Resist Pattern-Forming Method

The radiation-sensitive composition according to one embodiment of the invention is useful as a material for forming a chemically-amplified positive-tone resist film.

The chemically-amplified positive-tone resist film is designed so that the acid-labile group included in the polymer dissociates due to an acid generated by the photoacid generator upon exposure, so that the polymer becomes alkali-soluble. Specifically, an alkali-soluble area is formed in the resist film. The alkali-soluble area corresponds to the exposed area of the resist. The exposed area can be dissolved and removed using an alkaline developer. A positive-tone resist pattern having a desired shape can thus be formed. The resist pattern-forming method is described in detail below.

When forming a resist pattern using the radiation-sensitive composition according to one embodiment of the invention, a resist film is formed using the radiation-sensitive composition. The radiation-sensitive composition may be filtered through a filter having a pore size of about 0.2 μm after adjusting the total solid content, for example. The radiation-sensitive composition is applied to a substrate (e.g., silicon wafer or aluminum-coated wafer) using an appropriate application (coating) method (e.g., rotational coating, cast coating, or roll coating) to form a resist film. The resist film may optionally be pre-baked (PB) at about 70 to 160° C. The resist film is then exposed by applying radiation via a photomask that has a mask pattern for forming a desired (given) resist pattern. Examples of radiation that may be used for exposure include (extreme) deep ultraviolet rays such as KrF excimer laser light (wavelength: 248 nm), ArF excimer laser light (wavelength: 193 nm), EUV (extreme ultraviolet rays, wavelength: 13.5 nm), X-rays such as synchrotron radiation, charged particle rays such as electron beams, and the like. The exposure conditions (e.g., dose) may be appropriately determined depending on the composition of the radiation-sensitive composition, the type of additive, and the like. Note that liquid immersion lithography may also be used.

The resist film is preferably subjected to post-exposure bake (PEB) after exposure. PEB ensures smooth dissociation of the acid-labile group included in the polymer. The PEB temperature may be appropriately selected depending on the composition of the radiation-sensitive composition, but is preferably 30 to 200° C., and more preferably 50 to 170° C.

In order to maximize the potential of the radiation-sensitive composition, an organic or inorganic anti-reflective film may be formed on the substrate, as disclosed in Japanese Examined Patent Publication (KOKOKU) No. 6-12452 (Japanese Patent Application Publication (KOKAI) No. 59-93448), for example. A protective film may be formed on the resist film so that the resist film is not affected by basic impurities and the like contained in the environmental atmosphere, as disclosed in Japanese Patent Application Publication (KOKAI) No. 5-188598, for example. Note that these techniques may be used in combination.

The exposed resist film is developed to form a given resist pattern. An alkaline aqueous solution prepared by dissolving an alkaline compound in water is normally used as a developer used for development. Examples of the alkaline compound include sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene, 1,5-diazabicyclo-[4.3.0]-5-nonene, and the like. These alkaline compounds may be used either individually or in combination.

The concentration of the alkaline aqueous solution is preferably 10 mass % or less. If the concentration of the aqueous alkaline solution exceeds 10 mass %, the unexposed area may be dissolved in the developer.

The pH of in the developer is preferably 8 to 14, and more preferably 9 to 14.

The developer may be a solution of the alkaline compound, or may be a composition that includes the alkaline compound, an organic solvent, a surfactant, and the like.

Examples of the organic solvent include ketones such as acetone, methyl ethyl ketone, methyl isobutyl ketone, acetonylacetone, cyclopentanone, cyclohexanone, 3-methylcyclopentanone, and 2,6-dimethylcyclohexanone, alcohols such as methyl alcohol, ethyl alcohol, n-propyl alcohol, isopropyl alcohol, n-butyl alcohol, t-butyl alcohol, cyclopentanol, cyclohexanol, 1,4-hexanediol, and 1,4-hexanedimethylol, ethers such as tetrahydrofuran and dioxane, esters such as ethyl acetate, n-butyl acetate, and isoamyl acetate, aromatic hydrocarbons such as toluene and xylene, phenol, dimethylformamide, and the like. These organic solvents may be used either individually or in combination.

The organic solvent is preferably used in the developer in an amount of 100 parts by volume or less based on 100 parts by volume of the alkaline aqueous solution. If the amount of the organic solvent exceeds 100 parts by volume, the exposed area may remain undeveloped due to a decrease in developability.

The resist film is normally rinsed with water after development using the developer, and then dried.

EXAMPLES

The embodiments of the invention are further described below by way of examples. Note that the invention is not limited to the following examples. In the examples, the unit "parts" refers to "parts by mass" unless otherwise specified.

The polymer obtained in each example was subjected to GPC analysis and $^{13}$C-NMR analysis under the following conditions.

(1) Weight Average Molecular Weight (Mw) and Number Average Molecular Weight (Mn)

The weight average molecular weight (Mw) and the number average molecular weight (Mn) of the polymer were determined using GPC columns manufactured by Tosoh Corporation (G2000$_{HXL}$×2, G3000$_{HXL}$×1, G4000$_{HXL}$×1) (flow rate: 1.0 ml/min. eluant: tetrahydrofuran, column temperature: 40° C.). The Mw and the Mn were determined using monodisperse polystyrene as a standard. The dispersity (Mw/Mn) was calculated from the measured data.

(2) $^{13}$C-NMR Analysis

The polymer was subjected to $^{13}$C-NMR analysis using a nuclear magnetic resonance spectrometer "JNM-EX270" (manufactured by JEOL Ltd.).

1. Production of Monomer

Monomer Synthesis Example 1

16.1 g of a compound (X1) shown by the following formula, 12.2 g of methacrylic chloride, and 13.12 g of 1,4-diazabicyclo[2.2.2]octane were dissolved in 200 g of methylene chloride, and reacted for 6 hours under reflux. After completion of the reaction, ethyl acetate was added to the reaction solution, and the organic layer was washed with water. The organic layer was then purified by silica gel column chromatography using an ethyl acetate/n-hexane mixture (1/1 (volume ratio)) as an eluant to obtain a compound (X-1-1) shown by the following formula (yield: 60%).

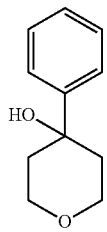

(X1)

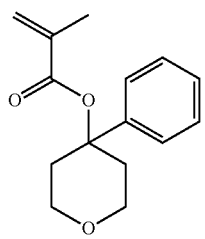

(X-1-1)

Monomer Synthesis Examples 2 to 5

Compounds (X-1-2) to (X-1-5) shown by the following formulas were synthesized in the same manner as in Monomer Synthesis Example 1, except for using respective compounds (X2) to (X5) shown by the following formulas instead of the compound (X1).

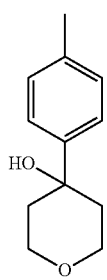

(X2)

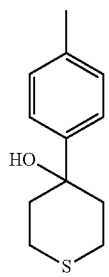

(X3)

(X4)

(X5)

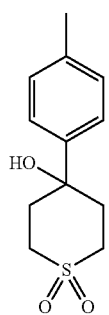

(X-1-2)

(X-1-3)

(X-1-4)

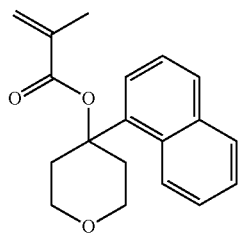

(X-1-5)

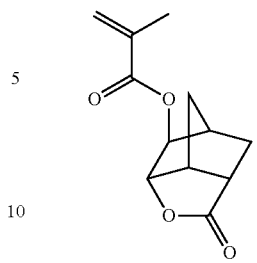

(M-3)

2. Production of Polymer

Polymer Production Example 1

Synthesis of Polymer (A-1)

5.5 g of p-acetoxystyrene, 4.5 g of the compound (X-1-1) obtained by Monomer Synthesis Example 1, 0.4 g of azobisisobutylonitrile (AIBN), and 0.1 g of t-dodecylmercaptan were dissolved in 10 g of propylene glycol monomethyl ether, and polymerized at 70° C. for 16 hours in a nitrogen atmosphere. After completion of polymerization, the reaction solution was added dropwise to 500 g of n-hexane to coagulate and purify the copolymer. After the addition of 7.5 g of propylene glycol monomethyl ether to the copolymer, 15 g of methanol, 4.0 g of triethylamine, and 1.0 g of water were added to the mixture. The mixture was hydrolyzed at 65° C. for 8 hours. After completion of hydrolysis, the solvent and triethylamine were evaporated under reduced pressure, and the resulting copolymer was dissolved in 10 g of acetone. The solution was added dropwise to 100 g of water to coagulate the copolymer. The resulting white powder was filtered, and dried at 50° C. overnight under reduced pressure.

The copolymer thus obtained had an Mw of 10,000 and a dispersity (Mw/Mn) of 2.4. The molar ratio of repeating units derived from p-hydroxystyrene and repeating units derived from the compound (X-1-1) determined by $^{13}$C-NMR analysis was 66:34. This copolymer is hereinafter referred to as "polymer (A-1)".

Polymer Production Example 2

Synthesis of Polymer (A-2)

54 g of the compound shown by the formula (X-1-2) (hereinafter may be referred to as "compound (X-1-2)"), 46 g of the compound shown by the following formula (M-3) (hereinafter may be referred to as "compound (M-3)"), and 2 g of azobisisobutylonitrile were dissolved in 300 g of methyl ethyl ketone. The compounds were polymerized at 78° C. for 6 hours in a nitrogen atmosphere. After completion of polymerization, the reaction solution was added dropwise to 2000 g of methanol to coagulate the copolymer. The copolymer was washed twice with 300 g of methanol. The resulting white powder was filtered, and dried at 50° C. overnight under reduced pressure.

The copolymer thus obtained had an Mw of 8900 and a dispersity (Mw/Mn) of 2.5. The molar ratio of repeating units derived from the compound (X-1-2) and repeating units derived from the compound (M-3) determined by $^{13}$C-NMR analysis was 48:52. This copolymer is hereinafter referred to as "polymer (A-2)".

Polymer Production Example 3

Synthesis of Polymer (A-3)

A copolymer was produced in the same manner as in Polymer Production Example 1, except for using the compound (X-1-2) obtained in Monomer Production Example 2 instead of the compound (X-1-1).

The resulting copolymer had an Mw of 12,000 and a dispersity (Mw/Mn) of 2.5. The molar ratio of repeating units derived from p-hydroxystyrene and repeating units derived from the compound (X-1-2) determined by $^{13}$C-NMR analysis was 67:33. This copolymer is hereinafter referred to as "polymer (A-3)".

Polymer Production Example 4

Synthesis of Polymer (A-4)

A copolymer was produced in the same manner as in Polymer Production Example 1, except for using the compound (X-1-3) obtained in Monomer Production Example 3 instead of the compound (X-1-1).

The resulting copolymer had an Mw of 11,000 and a dispersity (Mw/Mn) of 2.6. The molar ratio of repeating units derived from p-hydroxystyrene and repeating units derived from the compound (X-1-3) determined by $^{13}$C-NMR analysis was 65:35. This copolymer is hereinafter referred to as "polymer (A-4)".

Polymer Production Example 5

Synthesis of Polymer (A-5)

A copolymer was produced in the same manner as in Polymer Production Example 1, except for using the compound (X-1-4) obtained in Monomer Production Example 4 and a monomer (M-4) shown by the following formula instead of the compound (X-1-1).

The resulting copolymer had an Mw of 12,000 and a dispersity (Mw/Mn) of 2.6. The molar ratio of repeating units derived from p-hydroxystyrene, repeating units derived from the compound (X-1-4), and repeating units derived from the monomer (M-4) determined by $^{13}$C-NMR analysis was 60:25:15. This copolymer is hereinafter referred to as "polymer (A-5)".

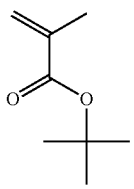

(M-4)

Polymer Production Example 6

Synthesis of Polymer (A-6)

A copolymer was produced in the same manner as in Polymer Production Example 1, except for using the compound (X-1-5) obtained in Monomer Production Example 5 instead of the compound (X-1-1).

The resulting copolymer had an Mw of 11,000 and a dispersity (Mw/Mn) of 2.4. The molar ratio of repeating units derived from p-hydroxystyrene and repeating units derived from the compound (X-1-5) determined by $^{13}$C-NMR analysis was 68:32. This copolymer is hereinafter referred to as "polymer (A-6)".

Comparative Polymer Production Example

Synthesis of Polymer (A-7)

109.6 g of p-acetoxystyrene, 90.4 g of a compound (M-2) shown by the following formula, 6.8 g of AIBN, and 2.6 g of t-dodecylmercaptan were dissolved in 200 g of propylene glycol monomethyl ether. The compounds were polymerized at 70° C. for 16 hours in a nitrogen atmosphere. After completion of polymerization, the reaction solution was added dropwise to 10,000 g of n-hexane to coagulate and purify the copolymer. After the addition of 150 g of propylene glycol monomethyl ether to the copolymer, 300 g of methanol, 80 g of triethylamine, and 15 g of water were added to the mixture. The mixture was then hydrolyzed at 65° C. for 8 hours. After completion of hydrolysis, the solvent and triethylamine were evaporated under reduced pressure, and the resulting copolymer was dissolved in 200 g of acetone. The solution was added dropwise to 200 g of water to coagulate the copolymer. The resulting white powder was filtered, and dried at 50° C. overnight under reduced pressure.

The resulting copolymer had an Mw of 11,000 and a dispersity (Mw/Mn) of 2.1. The molar ratio of repeating units derived from p-hydroxystyrene and repeating units derived from the compound (M-2) determined by $^{13}$C-NMR analysis was 65:35. This copolymer is hereinafter referred to as "polymer (A-7)".

(M-2)

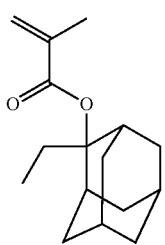

3. Production and Evaluation of Radiation-Sensitive Composition

Examples 1 to 15 and Comparative Examples 1 and 2

The polymer obtained as described above and the components shown below were mixed in the ratio shown in Table 1. The resulting mixture was filtered through a membrane filter having a pore size of 200 nm to obtain a radiation-sensitive composition.

(1) Polymer (A)

(A-1): polymer (A-1) obtained in Polymer Production Example 1

(A-2): polymer (A-2) obtained in Polymer Production Example 2

(A-3): polymer (A-3) obtained in Polymer Production Example 3

(A-4): polymer (A-4) obtained in Polymer Production Example 4

(A-5): polymer (A-5) obtained in Polymer Production Example 5

(A-6): polymer (A-6) obtained in Polymer Production Example 6

(A-7): polymer (A-7) obtained in Comparative Polymer Production Example (2) Photoacid Generator (B)

(B-1): triphenylsulfonium trifluoromethanesulfonate (B-2): triphenylsulfonium nonafluoro-n-butanesulfonate (B-3): triphenylsulfonium 1,1,2,2-tetrafluoro-2-(tetracyclo[4.4.0.1$^{2,5}$.1$^{7,10}$]dodecan-8-yl)ethanesulfonate (B-4): triphenylsulfonium 1,1-difluoro-2-(bicyclo[2.2.1]heptan-2-yl)ethanesulfonate (B-5): compound shown by the following formula (2x-16)

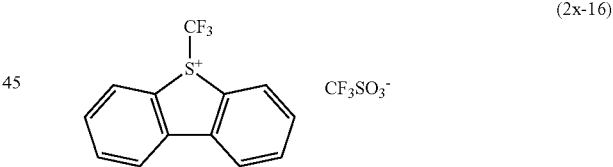

(2x-16)

(B-6): compound shown by the following formula (2x-17)

(B-7): compound shown by the following formula (2x-18)

(B-8): compound shown by the following formula (2x-19)

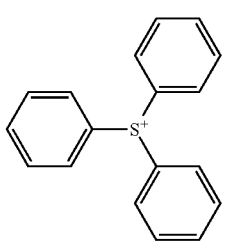

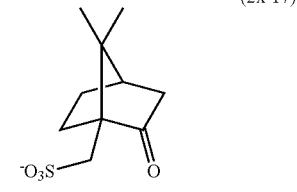

(2x-17)

-continued

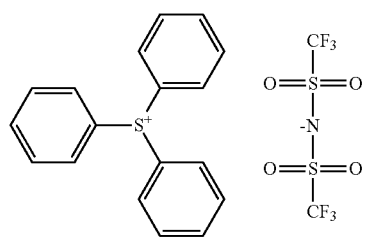

(2x-18)

(2x-19)

(3) Acid Diffusion Controller (C)
(C-1): tri-n-octylamine triphenylsulfonium salicylate
(C-3): N-t-butoxycarbonyl-2-phenylbenzimidazole
(4) Solvent (D)
(D-1): ethyl lactate
(D-2): propylene glycol monomethyl ether acetate
(D-3): cyclohexanone A resist pattern was formed using each composition, and evaluated as described below. The results are shown in Table 2.

The radiation-sensitive composition was spin-coated onto a silicon wafer using a system "CLEAN TRACK ACT-8" (manufactured by Tokyo Electron, Ltd.), and pre-baked (PB) under the conditions shown in Table 2 to form a resist film having a thickness of 60 nm. The resist film was exposed to electron beams using an electron beam drawing system ("HL800D" manufactured by Hitachi, Ltd., output: 50 KeV, current density: 5.0 A/cm$^2$). The resist film was then subjected to PEB under the conditions shown in Table 2. The resist film was developed at 23° C. for 1 minute by a puddle method using a 2.38% tetramethylammonium hydroxide aqueous solution, washed with purified water, and dried to obtain a resist pattern. The resist thus obtained was evaluated by the following methods.

(1) Sensitivity (L/S)

A dose at which a line-and-space pattern (1L1S) including a line area (width: 150 nm) and a space area (groove) (width: 150 nm) defined by the adjacent line areas was formed at a line width of 1:1 was defined as an optimum dose, and the sensitivity was evaluated based on the optimum dose.

Figure 2:
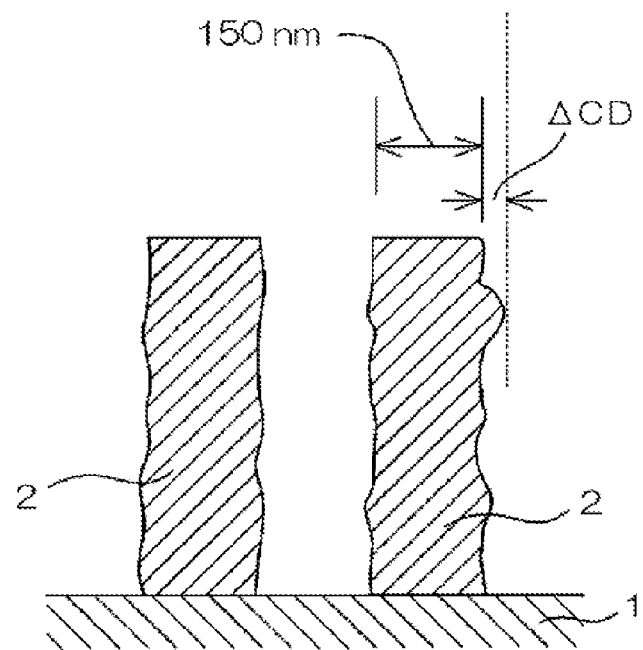
FIG. 2 is a cross-sectional view schematically showing the shape of a line pattern.

FIG. 1 is a plan view schematically showing the shape of the line-and-space pattern. FIG. 2 is a cross-sectional view schematically showing the shape of the line-and-space pattern. Note that elevations and depressions are exaggerated in FIGS. 1 and 2.

TABLE 1

| | Polymer (A) | | Acid generator (B) | | Acid diffusion controller (C) | | Solvent (D) | |
|---|---|---|---|---|---|---|---|---|
| | Type | Amount (parts) | Type | Amount (parts) | Type | Amount (parts) | Type | Amount (parts) |
| Example 1 | A-1 | 100 | B-1 | 9 | C-1 | 1 | D-1 | 1400 |
| | | | | | | | D-2 | 3300 |
| Example 2 | A-1 | 100 | B-1 | 9 | C-2 | 1 | D-1 | 1400 |
| | | | | | | | D-2 | 3300 |
| Example 3 | A-1 | 100 | B-2 | 9 | C-2 | 1 | D-1 | 1400 |
| | | | | | | | D-2 | 3300 |
| Example 4 | A-1 | 100 | B-3 | 9 | C-2 | 1 | D-1 | 1400 |
| | | | | | | | D-2 | 3300 |
| Example 5 | A-1 | 100 | B-4 | 9 | C-2 | 1 | D-1 | 1400 |
| | | | | | | | D-2 | 3300 |
| Example 6 | A-1 | 100 | B-5 | 9 | C-3 | 1 | D-1 | 1400 |
| | | | | | | | D-2 | 3300 |
| Example 7 | A-1 | 100 | B-6 | 9 | C-2 | 2 | D-1 | 1400 |
| | | | | | | | D-2 | 3300 |
| Example 8 | A-1 | 100 | B-7 | 10 | C-2 | 1 | D-1 | 1400 |
| | | | | | | | D-2 | 3300 |
| Example 9 | A-1 | 100 | B-8 | 10 | C-2 | 1 | D-1 | 1400 |
| | | | | | | | D-2 | 3300 |
| Example 10 | A-1 | 100 | B-6 | 10 | C-3 | 2 | D-1 | 1400 |
| | | | | | | | D-2 | 3300 |
| Example 11 | A-2 | 100 | B-3 | 10 | C-2 | 2 | D-2 | 1400 |
| | | | | | | | D-3 | 3300 |
| Example 12 | A-3 | 100 | B-6 | 10 | C-2 | 2 | D-1 | 1400 |
| | | | | | | | D-2 | 3300 |
| Example 13 | A-4 | 100 | B-6 | 10 | C-2 | 2 | D-1 | 1400 |
| | | | | | | | D-2 | 3300 |
| Example 14 | A-5 | 100 | B-6 | 10 | C-2 | 2 | D-1 | 1400 |
| | | | | | | | D-2 | 3300 |
| Example 15 | A-6 | 100 | B-6 | 10 | C-2 | 2 | D-1 | 1400 |
| | | | | | | | D-2 | 3300 |
| Comparative Example 1 | A-7 | 100 | B-1 | 9 | C-1 | 1 | D-1 | 1400 |
| | | | | | | | D-2 | 3300 |
| Comparative Example 2 | A-7 | 100 | B-7 | 10 | C-2 | 1 | D-1 | 1400 |
| | | | | | | | D-2 | 3300 |

(2) Nano Edge Roughness

The line pattern of a line-and-space pattern (1L1S) (design line width: 150 nm) was observed using a scanning electron microscope ("S-9220" manufactured by Hitachi, Ltd.). The nano edge roughness was evaluated by determining the difference "ΔCD" between the design line width (150 nm) and the line width in an area where elevations and depressions significantly occurred along a side 2a of a line area 2 of a resist film formed on a silicon wafer 1 (see FIGS. 1 and 2) using a CD-scanning electron microscope (SEM) ("S-9220" manufactured by Hitachi High-Technologies Corporation).

(3) Resolution (L/S)

The minimum line width (nm) of the line pattern of a line-and-space pattern (1L1S) that was resolved at the optimum dose was taken as the resolution.

TABLE 2

|  | PB conditions | | PEB conditions | | Sensitivity | Nano edge | Resolution |
| --- | --- | --- | --- | --- | --- | --- | --- |
|  | Temp. (°C.) | Time (s) | Temp. (°C.) | Time (s) | (μC/cm²) | roughness (nm) | (nm) |
| Example 1 | 130 | 90 | 80 | 90 | 24.0 | 12 | 70 |
| Example 2 | 130 | 90 | 80 | 90 | 23.0 | 12 | 70 |
| Example 3 | 130 | 90 | 80 | 90 | 23.0 | 11 | 70 |
| Example 4 | 130 | 90 | 80 | 90 | 21.0 | 10 | 60 |
| Example 5 | 130 | 90 | 80 | 90 | 23.0 | 10 | 60 |
| Example 6 | 130 | 90 | 80 | 90 | 16.0 | 10 | 70 |
| Example 7 | 130 | 90 | 90 | 90 | 25.0 | 10 | 60 |
| Example 8 | 130 | 90 | 80 | 90 | 23.0 | 10 | 60 |
| Example 9 | 130 | 90 | 80 | 90 | 22.0 | 11 | 70 |
| Example 10 | 130 | 90 | 110 | 90 | 22.0 | 11 | 60 |
| Example 11 | 130 | 90 | 110 | 90 | 20.0 | 9 | 60 |
| Example 12 | 130 | 90 | 100 | 90 | 22.0 | 11 | 60 |
| Example 13 | 130 | 90 | 100 | 90 | 23.0 | 10 | 60 |
| Example 14 | 130 | 90 | 100 | 90 | 24.0 | 10 | 60 |
| Example 15 | 130 | 90 | 100 | 90 | 22.0 | 10 | 70 |
| Comparative Example 1 | 130 | 90 | 80 | 90 | 35.0 | 16 | 100 |
| Comparative Example 2 | 130 | 90 | 80 | 90 | 34.0 | 15 | 110 |

As shown in Table 2, it was confirmed that the radiation-sensitive compositions of Examples 1 to 15 including the polymers (A-1) to (A-6) could produce a chemically-amplified positive-tone resist film that effectively responds to electron beams or extreme ultraviolet rays, shows only a small degree of roughness and excellent sensitivity and resolution, and accurately and stably produces a fine pattern, as compared with the radiation-sensitive compositions of Comparative Examples 1 and 2 including the polymer (A-7).

The radiation-sensitive composition according to the embodiment of the present invention may be used as a chemically-amplified resist that is suitable for microfabrication utilizing various types of radiation (e.g., (extreme) deep ultraviolet rays (e.g., KrF excimer laser light, ArF excimer laser light, $F_2$ excimer laser light, or EUV), X-rays (e.g., synchrotron radiation), and charged particle rays (e.g., electron beams)).

Since the radiation-sensitive composition according to the embodiments of the invention exhibits high resolution when forming a line-and-space pattern and shows only a small degree of nano edge roughness, the radiation-sensitive composition may be useful for forming a fine pattern using EB, EUV, or X-rays. Therefore, the radiation-sensitive composition may be useful as a material for forming a chemically-amplified resist for producing semiconductor devices that are expected to be further miniaturized in the future.

Obviously, numerous modifications and variations of the present invention are possible in light of the above teachings. It is therefore to be understood that within the scope of the appended claims, the invention may be practiced otherwise than as specifically described herein.

The invention claimed is:

1. A polymer comprising:
a repeating unit shown by a general formula (1),

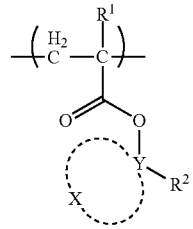

wherein $R^1$ represents a hydrogen atom, a methyl group, a fluorine atom, or a trifluoromethyl group, $R^2$ represents a substituted or unsubstituted aryl group having 6 to 22 carbon atoms, Y represents a carbon atom, and X represents —$X^1Z^1X^2$— which is an atomic group which forms a cyclic structure including a heteroatom together with Y, wherein $Z^1$ represents —O—, —S—, —CO—, —COO—, —SO—, or —$SO_2$—, and each of $X^1$ and $X^2$ individually represents a single bond, a methylene group, or an alkylene group having 2 to 25 carbon atoms, each of $X^1$ and $X^2$ being unsubstituted or substituted with a substituent, and optionally a carbon atom included in $X^1$ and a carbon atom include in $X^2$ being bonded via a divalent group.

2. The polymer according to claim 1, wherein the repeating unit shown by the general formula (1) is a repeating unit shown by a general formula (1-1), (1-1)

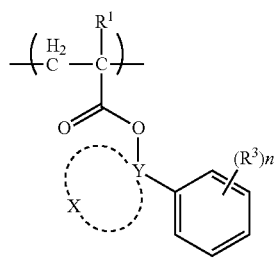

wherein
n is an integer from 0 to 3,
R¹ represents a hydrogen atom, a methyl group, a fluorine atom, or a trifluoromethyl group,
R³ represents a monovalent organic group, a hydroxyl group, or a halogen atom,
Y represents a carbon atom, and
X represents —X¹Z¹X²— which is an atomic group which forms a cyclic structure including a heteroatom together with Y, wherein
Z¹ represents —O—, —S—, —CO—, —COO—, —SO—, or —SO₂—, and
each of X¹ and X² individually represents a single bond, a methylene group, or an alkylene group having 2 to 25 carbon atoms, each of X¹ and X² being unsubstituted or substituted with a substituent, and optionally a carbon atom included in X¹ and a carbon atom included in X² being bonded via a divalent group.

3. The polymer according to claim 1, further comprising: one of a repeating unit shown by a general formula (2), a repeating unit shown by a general formula (3), a repeating unit shown by a general formula (4), a repeating unit shown by a general formula (5), a repeating unit shown by a general formula (N), or a combination thereof, (2)

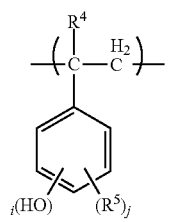

wherein R⁴ represents a hydrogen atom or a methyl group, R⁵ represents a hydrogen atom or a monovalent organic group, i is an integer from 0 to 3, and j is an integer from 0 to 3, wherein 0≦i+j≦5 is satisfied, (3)

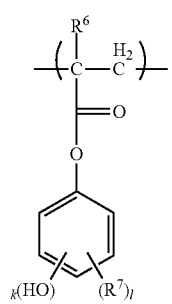

wherein R⁶ represents a hydrogen atom or a methyl group, R⁷ represents a hydrogen atom or a monovalent organic group, k is an integer from 0 to 3, and l is an integer from 0 to 3, wherein 0≦k+l≦5 is satisfied, (4)

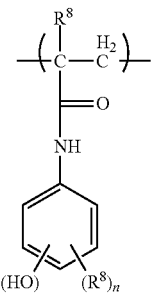

wherein R⁸ represents a hydrogen atom or a methyl group, R⁹ represents a hydrogen atom or a monovalent organic group, m is an integer from 0 to 3, and n is an integer from 0 to 3, wherein 0≦m+n≦5 is satisfied, (5)

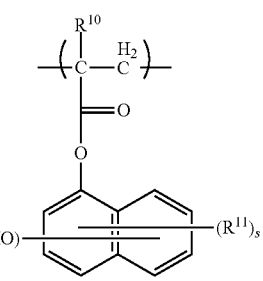

wherein R¹⁰ represents a hydrogen atom or a methyl group, R¹¹ represents a hydrogen atom or a monovalent organic group, r is an integer from 0 to 3, and s is an integer from 0 to 3, (N)

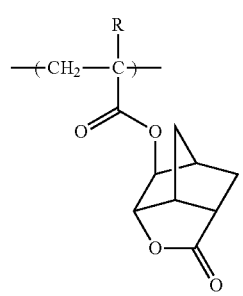

wherein R represents a hydrogen atom or methyl group.

4. A radiation-sensitive composition comprising:
the polymer according to claim 1, the polymer containing an acid-labile group; and
a photoacid generator.

5. The radiation-sensitive composition according to claim 4, wherein the photoacid generator is a compound shown by a general formula (b1), M⁺Z⁻    (b1)

wherein M⁺ represents a monovalent onium cation, and Z⁻ represents a monovalent anion shown by a general formula (9-1) or (9-2),

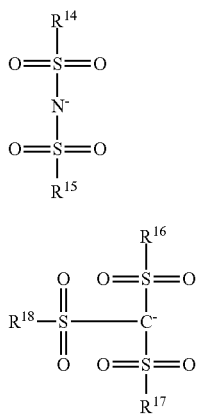

(9-1)

(9-2)

wherein
each of $R^{14}$ and $R^{15}$ individually represents an alkyl group having 1 to 20 carbon atoms and being substituted with at least one fluorine atom, or $R^{14}$ and $R^{15}$ bond to each other to form a cyclic structure having 1 to 20 carbon atoms and being substituted with at least one fluorine atom, and each of $R^{16}$, $R^{17}$, and $R^{18}$ individually represents an alkyl group having 1 to 20 carbon atoms and being substituted with at least one fluorine atom, or two of $R^{16}$, $R^{17}$, and $R^{18}$ bond to each other to form a cyclic structure having 1 to 20 carbon atoms and being substituted with at least one fluorine atom, and the remainder of $R^{16}$, $R^{17}$, and $R^{18}$ represents an alkyl group having 1 to 20 carbon atoms and being substituted with at least one fluorine atom.

6. A monomer which is a compound shown bra general formula (10),

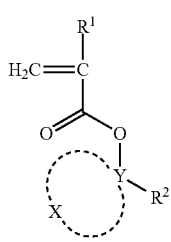

(10)

wherein
$R^1$ represents a hydrogen atom, a methyl group, a fluorine atom, or a trifluoromethyl group,
$R^2$ represents a substituted or unsubstituted aryl group having 6 to 22 carbon atoms,
Y represents a carbon atom, and
X represents —$X^1Z^1X^2$— which is an atomic group which forms a cyclic structure including a heteroatom together with Y, wherein $Z^1$ represents —O—, —S—, —CO—, —COO—, —SO—, or —$SO_2$—, and each of $X^1$ and $X^2$ individually represents a single bond, a methylene group, or an alkylene group having 2 to 25 carbon atoms, each of $X^1$ and $X^2$ being unsubstituted or substituted with a substituent, and optionally a carbon atom included in $X^1$ and a carbon atom included in $X^2$ being bonded via a divalent group.

7. A method of producing a compound shown by a general formula (10), comprising:
providing a first compound shown by a formula (AA) and a second compound, the second compound having a partial structure shown by a formula (BB); and
reacting the first compound and the second compound to replace $Y^1$ in the first compound with the partial structure in the second compound,

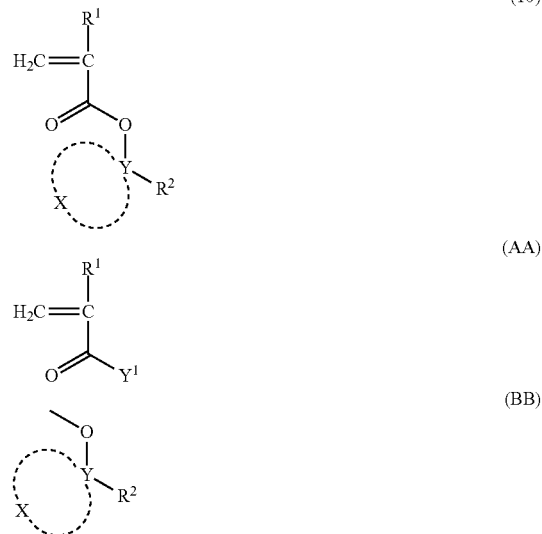

wherein
$R^1$ represents a hydrogen atom, a methyl group, a fluorine atom, or a trifluoromethyl group,
$R^2$ represents a substituted or unsubstituted aryl group having 6 to 22 carbon atoms,
Y represents a carbon atom,
$Y^1$ represents a halogen atom, and
X represents —$X^1Z^1X^2$— which is an atomic group which forms a cyclic structure including a heteroatom together with Y, wherein
$Z^1$ represents —O—, —S—, —CO—, —COO—, —SO—, or —$SO_2$—, and
each of $X^1$ and $X^2$ individually represents a single bond, a methylene group, or an alkylene group having 2 to 25 carbon atoms, each of X and $X^2$ being unsubstituted or substituted with a substituent, and optionally a carbon atom included in $X^1$ and a carbon atom included in $X^2$ being bonded via a divalent group.

* * * * *